US012640711B2

(12) United States Patent
Suzuki et al.

(10) Patent No.: US 12,640,711 B2
(45) Date of Patent: May 26, 2026

(54) SAMPLING RATE CONVERTER, SAMPLING RATE CONVERSION METHOD, AND COMMUNICATION SYSTEM

(71) Applicant: NTT Innovative Devices Corporation, Yokohama (JP)

(72) Inventors: Masashi Suzuki, Kanagawa (JP); Tsutomu Takeya, Kanagawa (JP); Yasuharu Onuma, Kanagawa (JP); Takahiro Hata, Kanagawa (JP); Yuki Hayashida, Kanagawa (JP)

(73) Assignee: NTT Innovative Devices Corporation, Yokohama (JP)

( * ) Notice: Subject to any disclaimer, the term of this patent is extended or adjusted under 35 U.S.C. 154(b) by 261 days.

(21) Appl. No.: 18/702,664

(22) PCT Filed: Dec. 8, 2022

(86) PCT No.: PCT/JP2022/045266
§ 371 (c)(1),
(2) Date: Apr. 18, 2024

(87) PCT Pub. No.: WO2023/135996
PCT Pub. Date: Jul. 20, 2023

(65) Prior Publication Data
US 2024/0421799 A1    Dec. 19, 2024

(30) Foreign Application Priority Data
Jan. 12, 2022   (JP) ................................ 2022-002797

(51) Int. Cl.
*H03H 17/02* (2006.01)
*H04B 10/61* (2013.01)
(52) U.S. Cl.
CPC ......... *H03H 17/02* (2013.01); *H04B 10/6165* (2013.01)

(58) Field of Classification Search
CPC ............................ H03H 17/02; H04B 10/6165
(Continued)

(56) References Cited

U.S. PATENT DOCUMENTS 9,853,734 B1 * 12/2017 Fan ...................... H04B 10/613
11,689,295 B2 * 6/2023 Beppu .................. H04B 10/616
                                                        398/208
(Continued)

FOREIGN PATENT DOCUMENTS

JP          2014-103639 A    6/2014
JP          2017-163281 A    9/2017
WO          2018/079598 A1    3/2018

OTHER PUBLICATIONS

International Search Report with Written Opinion of the International Searching Authority issued by the Japan Patent Office for International Patent Application No. PCT/JP2022/045266, mailed on Mar. 7, 2023, with a partial English translation.

*Primary Examiner* — Quan Zhen Wang
(74) *Attorney, Agent, or Firm* — Myers Wolin, LLC

(57) ABSTRACT

A sampling rate converter converting input signals d(i) (i=0, 1, 2, . . . ) sampled with an input sampling rate to output signals z(j) (j=0, 1, 2, . . . ) sampled with an output sampling rate that is M/N times the input sampling rate when M/N (M and N are integers equal to or larger than 1) is set as a conversion rate includes a digital filter configured with a plurality of sub-filters arranged in poly-phase, tap coefficients being set for the sub-filters, respectively, according to the conversion rate; route selection circuitry supplies each of the input signals inputted with the input sampling rate to at least one of the sub-filters of the digital filter according to the conversion rate; and a multiplexer outputting outputs of the plurality of sub-filters as the output signals with the output sampling rate in determined order according to the conversion rate.

7 Claims, 10 Drawing Sheets

(58) Field of Classification Search
USPC ......................................................... 398/204
See application file for complete search history.

(56) References Cited

U.S. PATENT DOCUMENTS

| | | | |
|---|---|---|---|
| 2015/0304660 A1 | 10/2015 | Koike et al. | |
| 2018/0175830 A1* | 6/2018 | Onuma | H04L 7/0087 |
| 2020/0052793 A1 | 2/2020 | Hamaoka et al. | |
| 2020/0076567 A1* | 3/2020 | Wala | G06F 12/1009 |
| 2023/0188220 A1* | 6/2023 | Wen | H04B 10/524 |
| | | | 398/208 |

* cited by examiner

Figure 2:
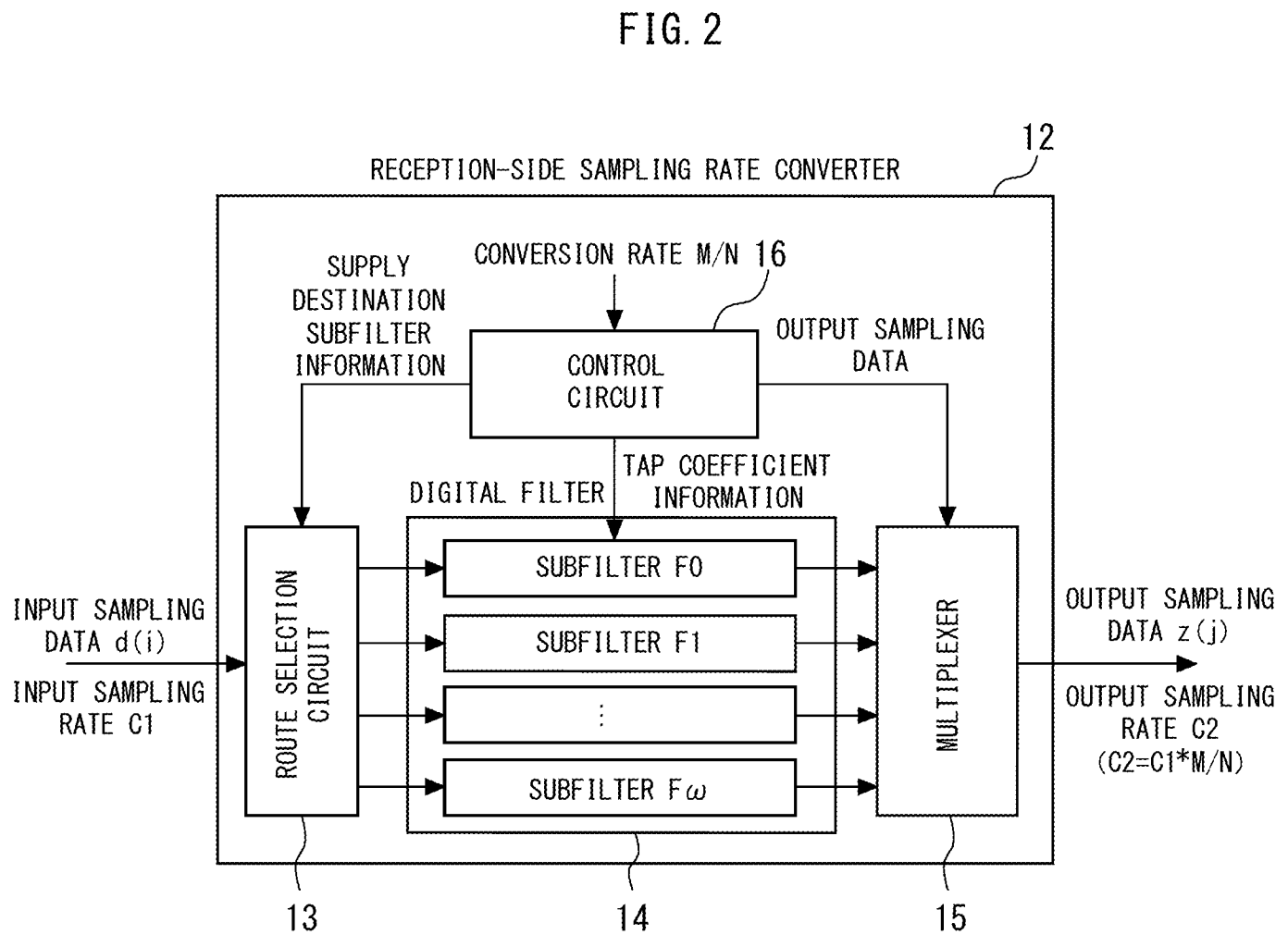

RECEPTION-SIDE SAMPLING RATE CONVERTER

12

CONVERSION RATE M/N

16

CONTROL CIRCUIT

OUTPUT SAMPLING DATA

SUPPLY DESTINATION SUBFILTER INFORMATION

TAP COEFFICIENT INFORMATION

DIGITAL FILTER

SUBFILTER F0

SUBFILTER F1

...

SUBFILTER Fω

14

ROUTE SELECTION CIRCUIT

13

MULTIPLEXER

15

OUTPUT SAMPLING DATA z(j)

OUTPUT SAMPLING RATE C2 (C2=C1*M/N)

INPUT SAMPLING DATA d(i)

INPUT SAMPLING RATE C1

SAMPLING RATE CONVERTER, SAMPLING RATE CONVERSION METHOD, AND COMMUNICATION SYSTEM

CROSS-REFERENCE TO RELATED APPLICATION

This application is a national stage application under 35 U.S.C. 371 of International Application No. PCT/JP2022/045266, filed on Dec. 8, 2022, and designated the U.S., which claims priority to Japanese Patent Application No. 2022-002797, filed on Jan. 12, 2022. The contents of each are herein incorporated by reference.

FIELD

The present disclosure relates to a sampling rate converter, a sampling rate conversion method, and a communication system.

BACKGROUND

In digital coherent optical communication, capacity has been more and more increasing due to digital signal processing technology. Though the transmission rate thereof is more and more increasing, it becomes necessary at the same time to support a wide range of transmission rates in order to respond to various client systems or transmission situations.

In general digital coherent optical communication, transmit digital data undergoes various kinds of signal processing, and is oversampled, converted to an analog baseband signal by a D/A converter, finally converted to an optical signal by a transmitting optical module, and transmitted to a receiving side via an optical fiber. On the receiving side, an analog baseband signal is extracted from the optical signal inputted to a receiving optical module and sampled by an A/D converter to be sampled signals. These sampled signals undergo various kinds of signal processing, and the transmit digital data is restored in the end. At this time, the sampling rate of the sampled signals is determined based on a sampling clock supplied to the A/D converter.

In order to support a wide range of transmission rates in such digital coherent optical communication, a plurality of sampling rates in transmission and reception are prepared in a wide range according to transmission rates. The range of sampling rates is, however, restricted due to hardware constraint, and it is difficult to respond to a wide range of sampling rates. For example, in a highly accurate configuration for realizing optical communication, the frequency variable range of a PLL that generates a sampling clock is restricted. Further, in the case of mounting a plurality of PLLs in order to widely cover the frequency variable range, not only problems from viewpoints of power consumption/ costs occur but also restrictions on the number of PLLs that can be mounted occur from a viewpoint of noise.

That is, though a plurality of sampling rates distributed in a wide range are used as sampling rates handled inside a signal processing circuit, sampling rates that can be supported by a D/A converter on a transmitter-side and an A/D converter on a receiver-side are restricted to a range narrower than the range. Therefore, conversion between the plurality of sampling rates in the wide range at the time of the signal processing circuit actually performing processing and the sampling rates that the D/A converter and the A/D converter can support is required. Specifically, on the transmitter-side, it is necessary to convert the plurality of sampling rates to be within a range that can be supported by the D/A converter. Furthermore, on the receiver-side, it is necessary to convert sampled signals within a range that can be supported by the A/D converter and the sampling clock to sampling rates suitable for subsequent signal processing.

Thus, in the recent digital coherent optical communication, it becomes necessary to convert a plurality of sampling rates due to the transmission rates becoming faster and the range becoming wider. Conversion of a sampling rate in a digital circuit generally means the sampling rate conversion by M/N (M and N are integers equal to or larger than 1) because of ease of realization and the like. In such conversion by M/N, first, by inserting zero data between samples of input data for interpolation in a filter unit, M times more data is determined. Next, a sampling unit thins out data from the M times more data to obtain 1/N times less data.

Since such a sampling rate converter requires a large-scale circuit, a plurality of techniques for reducing the circuit scale have been proposed. PTL 1 discloses a signal processing apparatus that converts a sampling rate to n/m times (n and m are integers equal to or larger than 1), and filtering is simplified by performing rate conversion of parallel transfer before a filter. PTL 2 discloses a method for, by performing adaptive equalization processing of a receive digital signal, for which the number of samples per receive symbol generated by A/D converter processing at the time of reception is M/N (M and N are positive integers), as it is, reducing power consumption of the adaptive equalization processing. PTL 3 discloses a sampling rate conversion apparatus that can perform parallel conversion to a plurality of sampling rates.

CITATION LIST

Patent Literature

[PTL 1] JP 2017-163281 A
[PTL 2] International Publication No. WO 2018/079598
[PTL 3] JP 2014-103639 A

SUMMARY

Problems to be Solved

In the methods of PTL 1 and PTL 2, conversion can be simplified for one sampling rate conversion. In the case of implementing a plurality of sampling rate conversions, however, circuits corresponding to the number of conversions are required, and there is a problem that the circuit scale increases, and power consumption also increases. In the method of PTL 3, a method for switching among a plurality of sampling rate conversions is complicated, and there is a problem that it is not possible to flexibly make settings of a plurality of sampling rates.

The present disclosure has been made to solve the problems as described above, and an object thereof is to obtain a sampling rate converter capable of easily performing sampling rate conversion with an arbitrary conversion rate, a sampling rate conversion method, and a communication system.

Solution to Problem

A sampling rate converter according to the present disclosure converting input sampled signals $d(i)$ ($i=0$, 1, 2, . . . ) sampled with an input sampling rate to output sampled signals $z(j)$ ($j=0, 1, 2, . . . $) sampled with an output sampling rate that is M/N times the input sampling rate when M/N (M and N are integers equal to or larger than 1) is set as a conversion rate, incudes a digital filter configured with a plurality of sub-filters arranged in poly-phase, tap coefficients being set for the sub-filters, respectively, according to the conversion rate; route selection circuitry supplying each of the input sampled signals inputted with the input sampling rate to at least one of the sub-filters of the digital filter according to the conversion rate; and a multiplexer outputting outputs of the plurality of sub-filters as the output sampled signals with the output sampling rate in determined order according to the conversion rate.

Advantageous Effects

In the present disclosure, a plurality of sampling rate conversions can be achieved with a simple configuration.

BRIEF DESCRIPTION OF THE DRAWINGS

FIG. 1 is a diagram showing a communication system according to an embodiment.

FIG. 2 is a diagram showing a sampling rate converter according to the embodiment.

FIG. 6 is a diagram for explaining operation of sampling rate conversion in the case of M/N=4/3.

FIG. 8 is a diagram visually showing the operation of sampling rate conversion in the case of M/N=4/3.

FIG. 11 is a diagram visually showing the operation of sampling rate conversion in the case of M/N=3/2.

DESCRIPTION OF EMBODIMENTS

Figure 1:
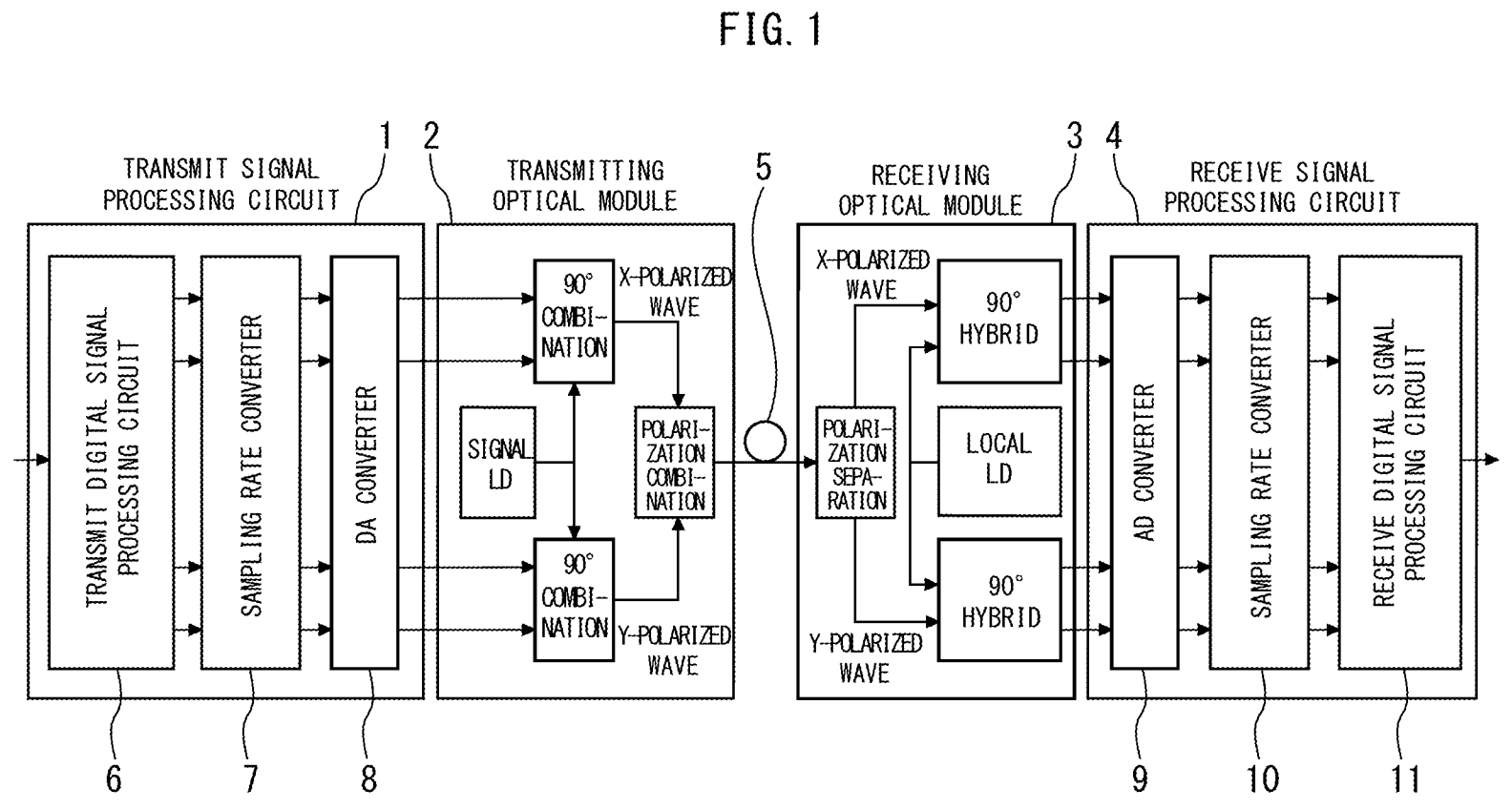
Figure 3:
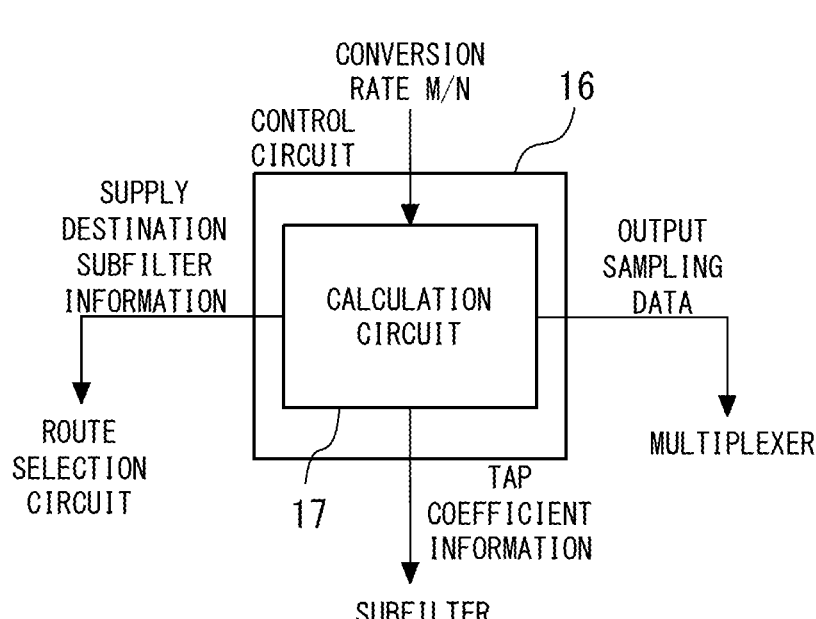
FIG. 3 is a diagram showing a configuration example of the control circuit.

FIG. 1 is a diagram showing a communication system according to an embodiment. The communication system is provided with a transmit signal processing circuit 1, a transmitting optical module 2, a receiving optical module 3, a receive signal processing circuit 4. The transmitting optical module 2 and the receiving optical module 3 are connected via an optical fiber 5.

For a transmit signal inputted to the transmit signal processing circuit 1, pre-equalization and error correction coding are performed in advance in a transmit digital signal processing circuit 6. An output signal of the transmit signal processing circuit 1 is sent to a D/A converter 8 via a transmitter-side sampling rate converter 7. The transmitter-side sampling rate converter 7 converts a sampling rate of data from a sampling rate with which it is easy for the transmit digital signal processing circuit 6 to perform processing to a sampling rate determined by the performance of the D/A converter 8. The D/A converter 8 converts an output signal of the transmitter-side sampling rate converter 7 to an analog electrical signal.

The transmitting optical module 2 converts an output signal of the D/A converter 8 to an optical signal by a laser diode and transmits the optical signal to a receiver-side via the optical fiber 5. On the receiver-side, the receiving optical module 3 converts the received optical signal to an analog electrical signal.

An A/D converter 9 converts an output signal of the receiving optical module 3 to a digital electrical signal. An output signal of the A/D converter 9 is supplied to a receive digital signal processing circuit 11 via a receive sampling rate converter 10. At this time, the output signal of the receiving optical module 3 is sampled with a rate determined by the performance of the A/D converter 9, but the receive sampling rate converter 10 converts the sampling rate of the output signal of the A/D converter 9 to a sampling rate with which it is easy for the receive digital signal processing circuit 11 to perform processing. The receive digital signal processing circuit 11 performs waveform distribution compensation, polarization dispersion compensation, error correction, and the like for the output signal of the transmit digital signal processing circuit 6.

FIG. 1 shows that the transmit data from the transmitter-side is transmitted through the receiver-side, being divided in an X-polarized signal and a Y-polarized signal. The present disclosure, however, is not limited to the above configuration but may be applicable to transmission with one of the polarized waves. In that case, the circuits for combination of polarized waves and for separation of polarized waves are not required. Further, the present disclosure is not limited to the optical communication shown in FIG. 1 but may be applicable to wireless communication or other communications.

FIG. 2 is a diagram showing a sampling rate converter 12 according to the embodiment. The transmitter-side sampling rate converter 7 or the receiver-side sampling rate converter 12 in FIG. 1 corresponds to the sampling rate converter 12 in FIG. 2. The sampling rate converter 12 multiplies a sampling rate of input sampled signals d(i) (i=0, 1, 2, . . . ) by M/N to output the input sampled signals d(i) as output sampled signals z(j) (j=0, 1, 2, . . . ). Here, M and N are integers equal to or larger than 1. If M/N is an irreducible fraction, the sampling rate converter can be easily configured. The input sampled signals d(i) are serially inputted, and the output sampled signals z(j) are serially outputted. Though it is possible to perform parallel input or parallel output, for example, using a data rate converter named GearBox, depending on a circuit configuration, it is not shown here. In that case, the number of data to be parallelized can be arbitrarily set.

The sampling rate converter 12 has a route selection circuit 13, a digital filter 14, a multiplexer 15, and a control circuit 16. The digital filter 14 has a plurality of sub-filters F0 to Fω. Here, M/N is referred to as a conversion rate. Since the multiplexer 15 multiplexes a plurality of signals, it is written as "multiplexer 15 (MUX)". It is, however, necessary to pay attention to that its operation may be different from a generally used multiplexer 15 in some points. Detailed operation of the multiplexer 15 will be explained below.

The input sampled signals d(i) are inputted to the sampling rate converter 12 with an input sampling rate C1. The output sampled signals z(j) are outputted from the sampling rate converter 12 with an output sampling rate C2. At this time, the output sampling rate C2=C1×(M/N) holds. That is, a series of signals represented by the input sampled signals d(i) are outputted as the output sampled signals z(j) with an M/N times higher sampling rate, in a state of the same waveform shape as the input being kept.

The digital filter 14 is a filter that performs interpolation of sampled signals at the time of converting a sampling rate, and is configured with an FIR filter with L taps. Generally, an FIR filter used to multiply a sampling rate by M/N can be realized by a polyphase filter configured with a plurality of sub-filters F0 to Fω. The polyphase filter is a configuration in which, by dividing an FIR filter into a plurality of sub-filters and performing calculation only for taps that contribute to output, calculation of the FIR filter is simplified. In this case, tap coefficients for the L stages are allocated to the plurality of sub-filters F0 to Fω according to a conversion rate M/N. This allocation is performed based on tap coefficient information from the control circuit 16 according to the conversion rate M/N. Specifically, the tap coefficients are set for the plurality of sub-filters F0 to Fω configured in advance, based on the tap coefficient information. That is, the configuration of the plurality of sub-filters F0 to Fω is determined based on the tap coefficient information from the control circuit 16. In actual designing, the configuration of the plurality of sub-filters F0 to Fω may be determined after determining the whole FIR filter, as described above, and it is also possible to form the whole FIR filter after determining the configuration of the plurality of sub-filters F0 to Fω first. Generally, with regard thereto, an optimal method is selected based on system requirements. In the present specification, L is assumed to be an odd number for convenience of explanation. The present disclosure, however, is applicable when L is an even number.

The route selection circuit 13 supplies the input sampled signals d(i) to a specified sub-filter based on supply destination sub-filter information from the control circuit 16, according to the conversion rate M/N. The number of supply destination sub-filters is not limited to one. There may be a case where there is a plurality of supply destination sub-filters or a case where data is supplied to the same sub-filter again. At this time, the input sampled signals d(i) are inputted to the route selection circuit 13 with the input sampling rate C1 and supplied from the route selection circuit 13 to the sub-filters or the sub-filter with the same rate.

The multiplexer 15 outputs the outputs of the sub-filters F0 to Fω as the output sampled signals z(j) based on output timing information from the control circuit 16, according to the conversion rate M/N. At this time, the outputs of the sub-filters F0 to Fω are supplied to the multiplexer 15 with the input sampling rate C1. The output sampled signals z(j) are outputted with the output sampling rate C2 according to the output timing information.

As described above, when the conversion rate is given, the control circuit 16 sequentially specifies supply destination sub-filters of the input sampled signals to the route selection circuit 13 and sequentially specifies output timings of the output sampled signals to the multiplexer 15. Such sequential specification can be performed by a simple repeatable circuit.

As shown below, the supply destination sub-filter information, the output timing information, and the tap coefficient information in the control circuit 16 can be calculated inside the control circuit 16, or calculation results can be stored in a memory or the like.

Figure 4:
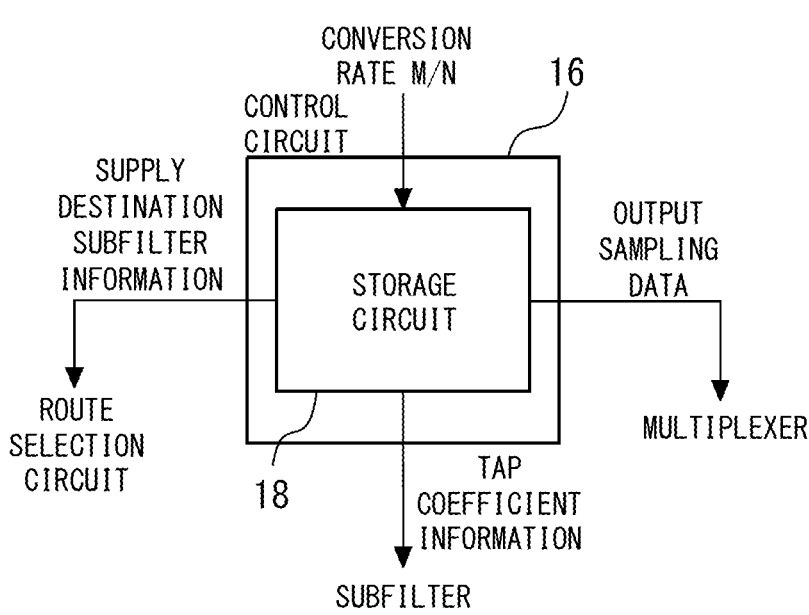
FIG. 4 is a diagram showing a configuration example of the control circuit.

FIGS. 3 and 4 are diagrams showing configuration examples of the control circuit. The control circuit 16 shown in FIG. 3 has a calculation circuit 17 for calculating the supply destination sub-filter information, the output timing information, and the tap coefficient information in the control circuit 16. The control circuit 16 shown in FIG. 4 has a storage circuit 18 that calculate each of the pieces of information described above in advance and stores results thereof. The storage circuit 18 can be easily configured with a memory or the like.

In the control circuit 16 shown in FIG. 3, when the conversion rate M/N is inputted, the supply destination sub-filter information, the tap coefficient information, and the output timing information are calculated in the calculation circuit 17 and outputted to the route selection circuit 13, the sub-filters F0 to Fω, and the multiplexer 15, respectively.

In the control circuit 16 shown in FIG. 4, supply destination sub-filter information, tap coefficient information, and output timing information for each of a plurality of conversion rates M/N assumed to be used are calculated and stored in the storage circuit 18 in advance. Then, supply destination sub-filter information, tap coefficient information, and output timing information for an inputted conversion rate M/N are read out and outputted to the route selection circuit 13, the sub-filters F0 to Fω, and the multiplexer 15, respectively.

Figure 5:
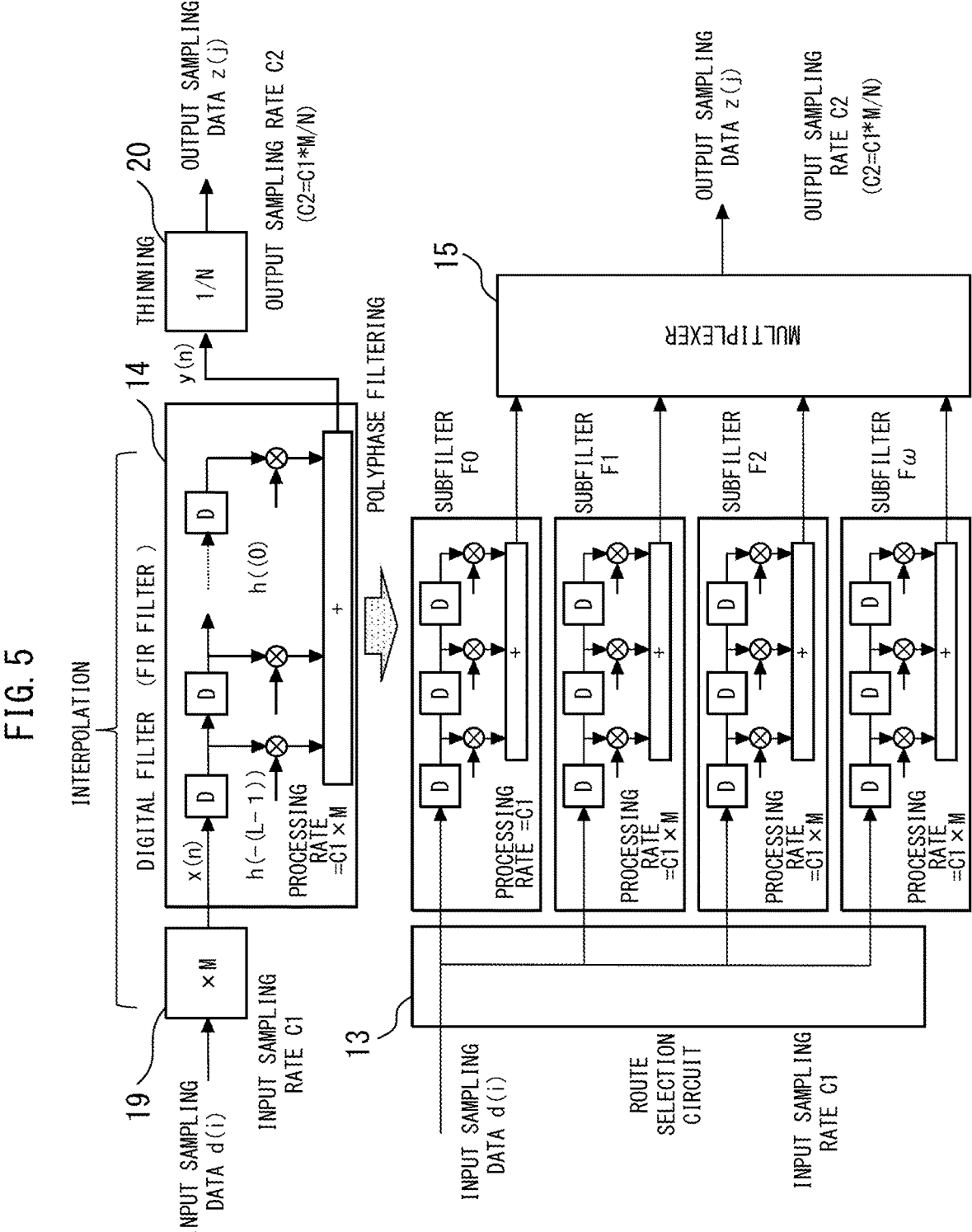
FIG. 5 is a diagram for explaining operation of the sampling rate converter according to the embodiment.

Next, operation of the sampling rate converter 12 will be explained. FIG. 5 is a diagram for explaining operation of the sampling rate converter according to the embodiment. A case where the conversion rate is M/N will be explained. The input sampled signals d(i) are inputted to the sampling rate converter 12 with the input sampling rate C1, and the output sampled signals z(j) are outputted from the sampling rate converter 12 with the output sampling rate C2 ($=$C1$\times$M/N).

A basic circuit of the sampling rate converter 12 is configured with a "$\times$M" circuit 19, an L-tap digital filter 14, and a "1/N" circuit 20. The "$\times$M" circuit 19 inserts (M$-$1) pieces of "0" data between the input sampled signals d(i) to generate filter input data x(n) (n$=$0, 1, 2, . . . ). For example, "0" data is inserted among input sampled signals d(0), d(1), . . . to generate filter input data x(0), x(1), x(2), x(3), x(4), . . . . If M$=$4 is assumed, x(0)$=$d(0), x(1)$=$x(2)$=$x(3)$=$0, x(4)$=$d(1), . . . hold. At this time, the sampling rate of x(n) is C1$\times$M.

The digital filter 14 interpolates the "0" data inserted in the filter input data x(n) to generate filter output data y(n) (n$=$0, 1, 2, . . . ). The processing rate of the digital filter 14 at this time is C1$\times$M. As the digital filter 14, a L-tap FIR filter can be used. A tap coefficient is set for each tap. The tap coefficients are set so that interpolation into the filter input data x(n) is appropriately performed. Further, the tap coefficients can be changed and stored for each conversion rate M/N. However, if the tap coefficients are set to such values that do not have to be changed even if the conversion rate M/N is changed, the memory amount for storing the tap coefficients can be reduced.

Following the interpolation by the digital filter 14, the "1/N" circuit 20 thins (N$-$1) pieces of data from the filter output data y(n) to generate the output sampled signals z(j). If N$=$3 is assumed, z(0)$=$y(0), z(1)$=$y(3), z(2)$=$y(6), . . . hold. Further, at this time, as for the output sampling rate of the output sampled signals z(j), C2$=$C1$\times$M/N holds.

From the above, sampling rate conversion by M/N is achieved for the input sampled signals d(i). The above configuration can be replaced with the route selection circuit 13, the plurality of sub-filters F0 to Fω, and the multiplexer 15 as shown in the lower part of FIG. 5. Configuring the "$\times$M" circuit 19 and the digital filter 14 with the plurality of sub-filters F0 to Fω is referred to as a polyphase filter. The sub-filters F0 to Fω are referred to as polyphase filters. Here, the "$\times$M" circuit 19 and the digital filter 14 are configured with the route selection circuit 13 and the plurality of sub-filters F0 to Fω. Furthermore, the processing rate of the sub-filters F0 to Fω is C1, which can be lower than the processing rate C1×M before polyphasing.

Next, the replacement (the polyphasing) described above will be explained. The filter output data y(n) can be represented by a formula for convolution of the filter input data x(n) and an impulse response h(n) of the digital filter 14 which is an FIR filter. The impulse response h(n) of the digital filter 14 corresponds to a value of each tap coefficient. If it is assumed that the digital filter 14 is an L-tap FIR filter (L=9), the tap coefficients are represented by impulse responses h(−8) to h(0). Then, the filter output data y(n) can be expressed as below. Here, h(0) is referred to as a top tap or 0th tap (right-end) tap coefficient; h(−1) is referred to as a 1st-tap coefficient, h(−2) is referred to as a 2nd-tap coefficient, . . . , h(−8) is referred to as an 8th-tap or final-(left-end) tap coefficient. The reason why the tap coefficients are represented by h(−8) to h(0) is that an output in the case of the filter input data x(0) having been inputted up to the h(0) of the taps of the FIR filter is to be represented by y(0).

$$y(n) = \qquad\qquad \text{[Math. 1]}$$

$$x(n) * h(n) = h(n) * x(n) = \sum_{k=-\infty}^{\infty} h(k)x(n-k) = \sum_{k=-8}^{0} h(k)x(n-k)$$

$$= h(-8)x(n+8) + h(-7)x(n+7) +$$

$$h(-6)x(n+6) + h(-5)x(n+5) + h(-4)x(n+4)$$

$$+ h(-3)x(n+3) + h(-2)x(n+2) + h(-1)x(n+1) + h(0)x(n)$$

For n=0, 1, 2 . . . . Math. 1 becomes the equations below. These are outputs y(n) of the digital filter 14.

$$y(0) = h(-8) \times (8) + h(-7) \times (7) + h(-6) \times (6) + h(-5) \times (5) + h(-4) \times (4) \qquad \text{[Math. 2]}$$
$$h(-3) \times (3) + h(-2) \times (2) + h(-1) \times (1) + h(0) \times (0)$$

$$y(1) = h(-8) \times (9) + h(-7) \times (8) + h(-6) \times (7) + h(-5) \times (6) + h(-4) \times (5)$$
$$h(-3) \times (4) + h(-2) \times (3) + h(-1) \times (2) + h(0) \times (1)$$

$$y(2) = h(-8) \times (10) + h(-7) \times (9) + h(-6) \times (8) + h(-5) \times (7) + h(-4) \times (6)$$
$$h(-3) \times (5) + h(-2) \times (4) + h(-1) \times (3) + h(0) \times (2)$$

$$y(3) = h(-8) \times (11) + h(-7) \times (10) + h(-6) \times (9) + h(-5) \times (8) + h(-4) \times (7)$$
$$h(-3) \times (6) + h(-2) \times (5) + h(-1) \times (4) + h(0) \times (3)$$

$$y(4) = h(-8) \times (12) + h(-7) \times (11) + h(-6) \times (10) + h(-5) \times (9) + h(-4) \times (8)$$
$$h(-3) \times (7) + h(-2) \times (6) + h(-1) \times (5) + h(0) \times (4)$$

$$y(5) = h(-8) \times (13) + h(-7) \times (12) + h(-6) \times (11) + h(-5) \times (10) + h(-4) \times (9)$$
$$h(-3) \times (8) + h(-2) \times (7) + h(-1) \times (6) + h(0) \times (5)$$

$$y(6) = h(-8) \times (14) + h(-7) \times (13) + h(-6) \times (12) + h(-5) \times (11) + h(-4) \times (10)$$
$$h(-3) \times (9) + h(-2) \times (8) + h(-1) \times (7) + h(0) \times (6)$$

$$y(7) = h(-8) \times (15) + h(-7) \times (14) + h(-6) \times (13) + h(-5) \times (12) + h(-4) \times (11)$$
$$h(-3) \times (10) + h(-2) \times (9) + h(-1) \times (8) + h(0) \times (7)$$

$$y(8) = h(-8) \times (16) + h(-7) \times (15) + h(-6) \times (14) + h(-5) \times (13) + h(-4) \times (12)$$
$$h(-3) \times (11) + h(-2) \times (10) + h(-1) \times (9) + h(0) \times (8)$$

$$y(9) = h(-8) \times (17) + h(-7) \times (16) + h(-6) \times (15) + h(-5) \times (14) + h(-4) \times (13)$$
$$h(-3) \times (12) + h(-2) \times (11) + h(-1) \times (10) + h(0) \times (9)$$

$$y(10) = h(-8) \times (18) + h(-7) \times (17) + h(-6) \times (16) + h(-5) \times (15) + h(-4) \times (14)$$
$$h(-3) \times (13) + h(-2) \times (12) + h(-1) \times (11) + h(0) \times (10)$$

$$y(11) = h(-8) \times (19) + h(-7) \times (18) + h(-6) \times (17) + h(-5) \times (16) + h(-4) \times (15)$$
$$h(-3) \times (14) + h(-2) \times (13) + h(-1) \times (12) + h(0) \times (11)$$

$$y(12) = h(-8) \times (20) + h(-7) \times (19) + h(-6) \times (18) + h(-5) \times (17) + h(-4) \times (16)$$
$$h(-3) \times (15) + h(-2) \times (14) + h(-1) \times (13) + h(0) \times (12)$$

$$y(13) = h(-8) \times (21) + h(-7) \times (20) + h(-6) \times (19) + h(-5) \times (18) + h(-4) \times (17)$$
$$h(-3) \times (16) + h(-2) \times (15) + h(-1) \times (14) + h(0) \times (13)$$

$$y(14) = h(-8) \times (22) + h(-7) \times (21) + h(-6) \times (20) + h(-5) \times (19) + h(-4) \times (18)$$
$$h(-3) \times (17) + h(-2) \times (16) + h(-1) \times (15) + h(0) \times (14)$$

$$y(15) = h(-8) \times (23) + h(-7) \times (22) + h(-6) \times (21) + h(-5) \times (20) + h(-4) \times (19)$$
$$h(-3) \times (18) + h(-2) \times (17) + h(-1) \times (16) + h(0) \times (15)$$

. . .

[Operation in the Case of Conversion Rate M/N=4/3]

Next, operation in the case of the conversion rate M/N=4/3 (M=4, N=3) will be explained. Here, as for the number of taps of the digital filter 14, L=9 holds.

For M=4, the "×M" circuit 19 inserts three "0's" between the input sampled signals d(0), d(1), . . . to generate the filter input data x(0), x(1), x(2), x(3), x(4), . . . . At this time, pieces of filter input data other than x(0), x(4), and x(8), . . . become 0. Therefore, Math. 2 becomes the equations below. At this time, the processing rate of the digital filter 14 is C1.

$$y(0) = h(-8) \times (8) + h(-4) \times (4) + h(0) \times (0) \qquad \text{[Math. 3]}$$
$$y(1) = h(-7) \times (8) + h(-3) \times (4)$$
$$y(2) = h(-6) \times (8) + h(-2) \times (4)$$
$$y(3) = h(-5) \times (8) + h(-1) \times (4)$$
$$y(5) = h(-7) \times (12) + h(-3) \times (8)$$
$$y(6) = h(-6) \times (12) + h(-2) \times (8)$$
$$y(7) = h(-5) \times (12) + h(-1) \times (8)$$
$$y(8) = h(-8) \times (16) + h(-4) \times (12) + h(0) \times (8)$$
$$y(9) = h(-7) \times (16) + h(-3) \times (12)$$
$$y(10) = h(-6) \times (16) + h(-2) \times (12)$$
$$y(11) = h(-5) \times (16) + h(-1) \times (12)$$
$$y(12) = h(-8) \times (20) + h(-4) \times (16) + h(0) \times (12)$$
$$y(13) = h(-7) \times (20) + h(-3) \times (16)$$
$$y(14) = h(-6) \times (20) + h(-2) \times (16)$$
$$y(15) = h(-5) \times (20) + h(-1) \times (16)$$
$$\cdots$$

Here, according to Math. 3, between h(−8) and h(0) of the 9-tap FIR filter, h(−8), h(−4), and h(0) are used in order to obtain a result of y(0); h(−7) and h(−3) are used in order to obtain a result of y(1); h(−6) and h(−2) are used in order to obtain a result of y(2); h(−5) and h(−1) are used in order to obtain a result of y(3); h(−8), h(−4), and h(0) are used again in order to obtain a result of y(4); h(−7) and h(−3) are used again in order to obtain a result of y(5); h(−6) and h(−2) are used again in order to obtain a result of y(6); and h(−5) and h(−1) are used again in order to obtain a result of y(7).

Thus, between h(−8) and h(0), every Mth (M−4) tap coefficient is selected to configure the following four sub-filters:

$$\text{Sub–filter } F0 = \{h(-8),\ h(-4),\ h(0)\}$$
$$\text{Sub–filter } F1 = \{h(-7),\ h(-3)\}$$
$$\text{Sub–filter } F2 = \{h(-6),\ h(-2)\}$$
$$\text{Sub–filter } F3 = \{h(-5),\ h(-1)\}$$

Calculation is repeated for the sub-filters F0 to F3, and the filter output data y(n) are sequentially generated. That is, in the case of M=4, the 9-tap digital filter 14 is divided into the four sub-filters F0 to F3 by polyphase filtering. Each of these sub-filters F0 to F3 is configured with three or two taps. In FIG. 5, however, each of all the sub-filters F0 to F3 is shown as being configured with three taps. This is because, if each sub-filter is configured with the maximum number of taps that can be designed (three taps in this case), it becomes possible to respond to various M's. In the case of two taps, the tap coefficient for the top tap is set to 0, and only the following two taps of taps can be used. It is also possible to configure the three-tap polyphase filters first and, thereby, configure the whole FIR filter.

Specifically, in the control circuit 16 shown in FIG. 2, configurations of the sub-filters F0 to F3 for given M are calculated, and tap coefficients are set for the sub-filters F0 to F3 as tap coefficient information according to the configuration of the sub-filters F0 to F3. In the case of M=4 described above, tap coefficients {h(−8), h(−4), h(0)} are set for the sub-filters F0; tap coefficients {h(−7), h(−3), 0} are set for the sub-filters F1; tap coefficients {h(−6), h(−2), 0} are set for the sub-filters F2; and tap coefficients {h(−5), h(−1), 0} are set for the sub-filters F3. If tap coefficient information for the conversion rate M/N is stored in advance in the storage circuit 18 of the control circuit 16 shown in FIG. 4, and predetermined tap coefficients are set for the sub-filters F0 to F3 according to the setting of the conversion rate M/N, then it is possible to easily configure the polyphase filters. At this time, the processing rate of each of the sub-filters F0 to F3 is C1.

Next, the "1/N" circuit 20 decimated the output data from filter y(0), y(1), y(2), . . . , by a factor of N (N=3). In this case, Math. 3 becomes the equations below.

$$y(0) = h(-8) \times (8) + h(-4) \times (4) + h(0) \times (0) \qquad \text{[Math. 4]}$$
$$y(3) = h(-5) \times (8) + h(-1) \times (4)$$
$$y(6) = h(-6) \times (12) + h(-2) \times (8)$$
$$y(9) = h(-7) \times (16) + h(-3) \times (12)$$
$$y(12) = h(-8) \times (20) + h(-4) \times (16) + h(0) \times (12)$$
$$y(15) = h(-5) \times (20) + h(-1) \times (16)$$
$$\cdots$$

According to Math. 4, in the "1/N" circuit 20, between h(−8) to h(0) of the 9-tap FIR filter, h(−8), h(−4), and h(0) (=the sub-filter F0) are used in order to obtain a result of y(0); h(−5) and h(−1) (=the sub-filter F3) are used in order to obtain a result of y(3); h(−6) and h(−2) (=the sub-filter F2) are used in order to obtain a result of y(6); h(−7) and h(−3) (=the sub-filter F1) are used in order to obtain a result of y(9); h(−8), h(−4), and h(0) (=the sub-filter F0) are used again in order to obtain a result of y(12); and h(−5) and h(−1) (=the sub-filter F3) are used again in order to obtain a result of y(15).

Thus, in the "1/N" circuit 20, calculation is repeated in order of the sub-filters F0, F3, F2, and F1, and filter output data are outputted in order of y(0), y(3), y(6), and y(9), . . . .

Relationships between the input sampled signals d(i) and the filter input data x(n) to the digital filter 14 are as follows:

$$d(0)=x(0)$$
$$d(1)=x(4)$$
$$d(2)=x(8)$$
$$d(3)=x(12)$$
. . .

Relationships between the filter output data y(n) of the digital filter 14 and the output sampled signals z(j) are as follows:

$$z(0)=y(0)$$

$$z(1)=y(3)$$

$$z(2)=y(6)$$

$$z(3)=y(9)$$

. . .

Therefore, when Math. 4 is rewritten using the input sampled signals d(i) and the output sampled signals z(j), the equations below are obtained.

$$z(0) = h(-8)d(2) + h(-4)d(1) + h(0)d(0) \qquad \text{[Math. 5]}$$

$$z(1) = h(-5)d(2) + h(-1)d(1)$$

$$z(2) = h(-6)d(3) + h(-2)d(2)$$

$$z(3) = h(-7)d(4) + h(-3)d(3)$$

$$z(4) = h(-8)d(5) + h(-4)d(4) + h(0)d(3)$$

$$z(5) = h(-5)d(5) + h(-1)d(4)$$

...

Figure 6:
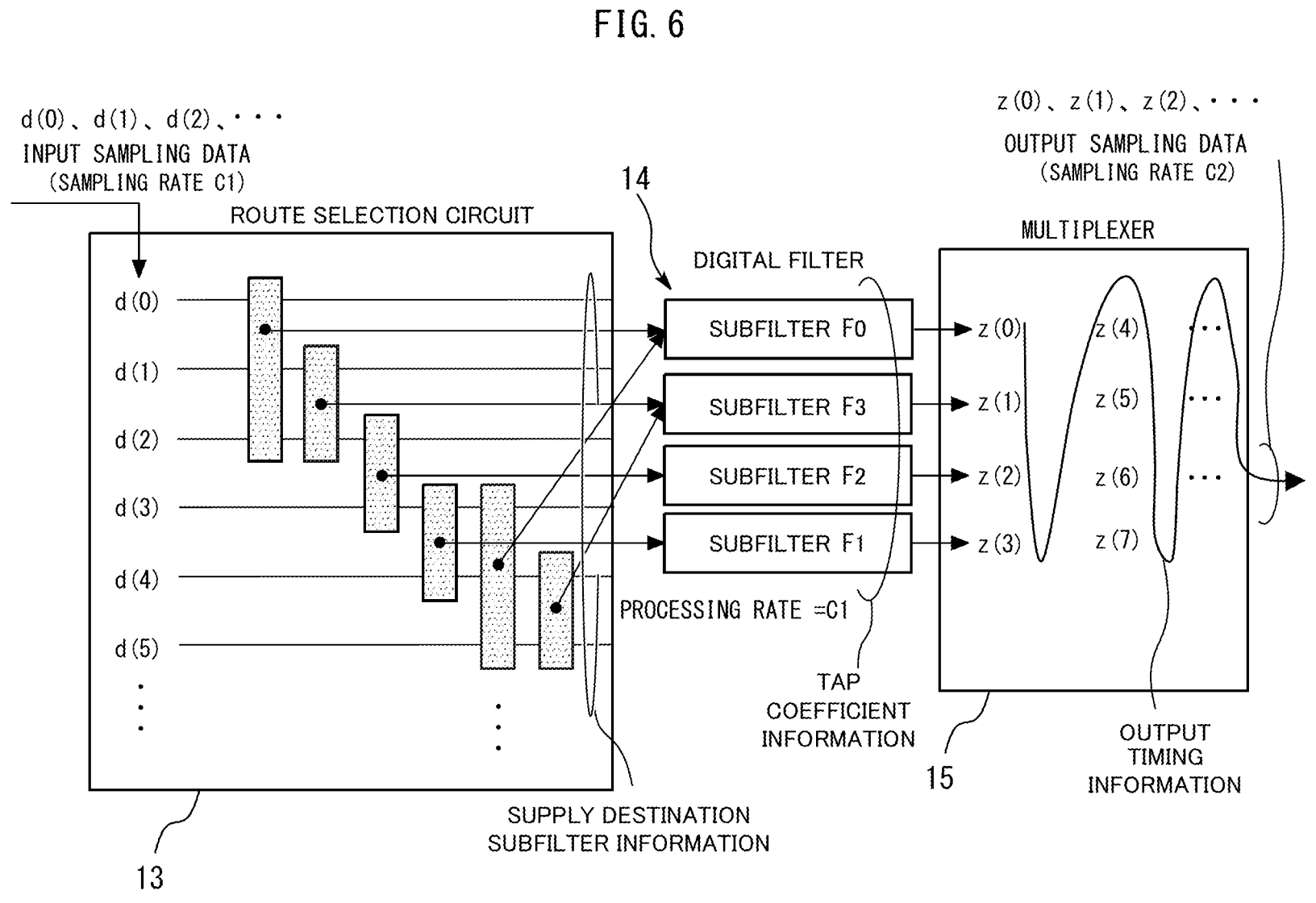

FIG. 6 is a diagram for explaining operation of sampling rate conversion in the case of M/N=4/3. When Math. 5 is expressed for the input sampled signals d(i), FIG. 6 is obtained. In FIG. 6, straight lines representing the input sampled signals d(i) are drawn in a horizontal direction; ranges of data to be supplied to the sub-filters F0 to F3 among the input sampled signals d(i) are represented by vertically long rectangles; and which of the sub-filters F0 to F3 each of the input sampled signals d(i) is supplied to is indicated by an arrow extending from each rectangle. Further, it is indicated by right arrows that outputs of the sub-filters F0 to F3 become the output sampled signals z(j). FIG. 6 shows that the input sampled signals d(i) are sequentially inputted to the route selection circuit, and the output sampled signals z(j) are sequentially outputted from the multiplexer. The configuration in the route selection circuit shows not an actual configuration but an image of operation of processing. It is also possible to input or output the above data all together as parallel data. The data are sequentially processed in the sampling rate converter.

According to FIG. 6, the input sampled signals d(0), d(1), and d(2) are inputted to the sub-filter F0 and outputted as output sampled signals z(0). The input sampled signals d(1) and d(2) are inputted to the sub-filter F3 and outputted as output sampled signals z(1). The input sampled signals d(2) and d(3) are inputted to the sub-filter F2 and outputted as output sampled signals z(2). The input sampled signals d(3) and d(4) are inputted to the sub-filter F1 and outputted as output sampled signals z(3). The input sampled signals d(3), d(4), and d(5) are inputted to the sub-filter F0 again and outputted as output sampled signals z(4).

The outputs of the sub-filters F0, F3, F2, F1, F0, . . . are sequentially selected and sequentially outputted from the multiplexer as the output sampled signals z(0), z(1), z(2), z(3), z(4), . . .

Thus, the sub-filters F0 to F3 can be repeatedly used. The order of repetition of the sub-filters F0 to F3 can be calculated as sub-filter F[(j×N) % M] (wherein "(j×N) % M" means a remainder of division of (j×N) by M).

At this time, when the input sampled signals d(i) are seen in order of being inputted, the input sampled signals d(0) is inputted to the sub-filter F0. The input sampled signals d(1) is inputted to the sub-filters F0 and F3. The input sampled signals d(2) is inputted to the sub-filters F0, F3, and F2. The input sampled signals d(3) is inputted to the sub-filters F2, F1, and F0. The input sampled signals d(4) is inputted to the sub-filters F1, F0, and F3.

Relationships between the input sampled signals d(i) and the supply destination sub-filters can be shown like Table 1 below.

TABLE 1

| i | INPUT SAMPLED SIGNALS d(i) | SUPPLY DESTINATION SUB-FILTER |
|---|---|---|
| 0 | d(0) | F0 |
| 1 | d(1) | F0□F3 |
| 2 | d(2) | F0□F3□F2 |
| 3 | d(3) | F2□F1□F0 |
| 4 | d(4) | F1□F0□F3 |
| 5 | d(5) | F0□F3□F2 |
| 6 | d(6) | F2□F1□F0 |
| 7 | d(7) | F1□F0□F3 |
| 8 | d(8) | F0□F3□F2 |
| 9 | d(9) | F2□F1□F0 |
| 10 | d(10) | F1□F0□F3 |
| □□□ | □□□ | □□□ |

As described above, when the conversion rate M/N and the number of taps L are determined, which of the sub-filters F0 to F3 each of the input sampled signals d(i) is to be inputted to is uniquely determined. Further, according to Table 1, from d(5), the supply destination sub-filters for d(2) to d(4) are repeated. Therefore, if the repetition situation is recorded in the storage circuit 18 in the control circuit 16, it is possible to easily specify a supply destination sub-filter as supply destination sub-filter information according to an input of the value i. The route selection circuit 13 of the sampling rate converter 12 supplies the input sampled signals d(i) to the specified sub-filters F0 to F3 according to the supply destination sub-filter information from the control circuit 16.

Figure 7:
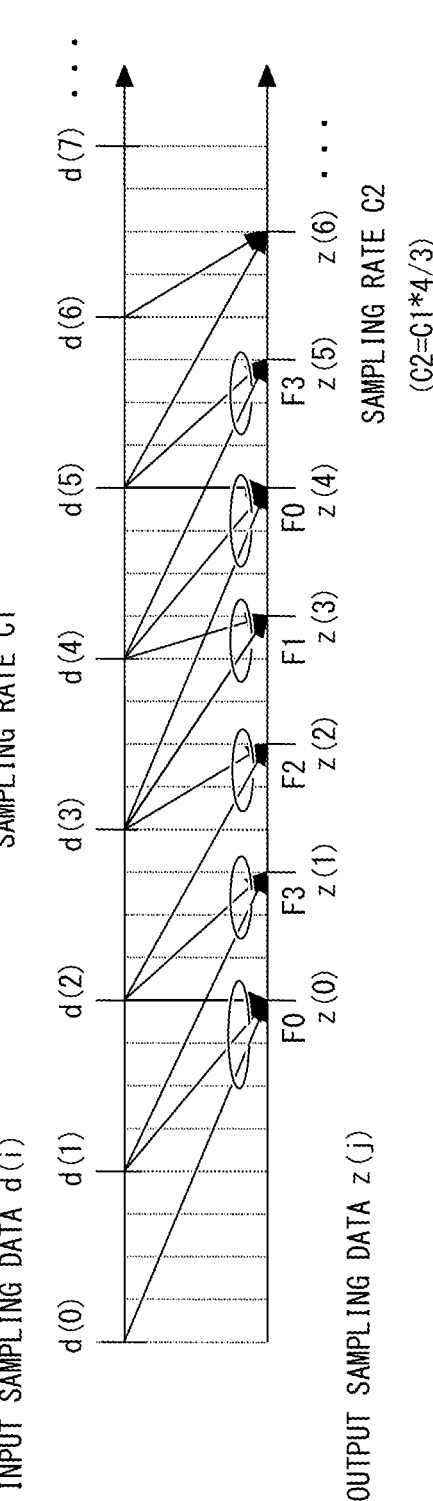
FIG. 7 is a diagram showing relationships between timings of the input sampled signals and timings of the output sampled signals in the case of M/N=4/3.

FIG. 7 is a diagram showing relationships between timings of the input sampled signals and timings of the output sampled signals in the case of M/N=4/3. The upper part of the diagram shows input timings of the input sampled signals d(i), and the lower part shows output timings of the output sampled signals z(j). A fine scale in the horizontal direction indicates an image of basic clocks. Each of the input sampled signals d(i) is inputted every four clocks, and each of the output sampled signals z(j) is outputted every three clocks. Thereby, it is seen that the output sampling rate C2 is converted to 4/3 times higher than the input sampling rate C1 (the period is converted to 3/4 times).

According to FIG. 7, the input sampled signals d(0), d(1), and d(2) are supplied to the sub-filter F0 and outputted as the output sampled signals z(0). The input sampled signals d(1) and d(2) are supplied to the sub-filter F3 and outputted as the output sampled signals z(1). The input sampled signals d(2) and d(3) are supplied to the sub-filter F2 and outputted as the output sampled signals z(2). The input sampled signals d(3) and d(4) are supplied to the sub-filter F1 and outputted as the output sampled signals z(3). The input sampled signals d(3), d(4), and d(5) are supplied to the sub-filter F0 and outputted as the output sampled signals z(4). The output sampled signals z(0), z(1), z(2), z(3), z(4), . . . are outputted with the output sampling rate C2. The above is the operation of the multiplexer 15.

In the case of the output sampled signals z(0) being outputted, since all the data (here, d((0), d(1), and d(2)) has to be supplied to the sub-filter F0, the output sampled signals z(0) is outputted after the input sampled signals d(2) is supplied.

Further, it is also possible to input the input sampled signals in parallel and output the output sampled signals in parallel. In this case, the same number of pieces of input sampled signals as the number of parallel inputs are inputted at a time, and the same number of pieces of output sampled signals as the number of parallel outputs are outputted at a time. The relationships between timings of the input sampled signals inputted in parallel and timings of the output sampled signals outputted in parallel are the same as the relationship described above.

Figure 8:
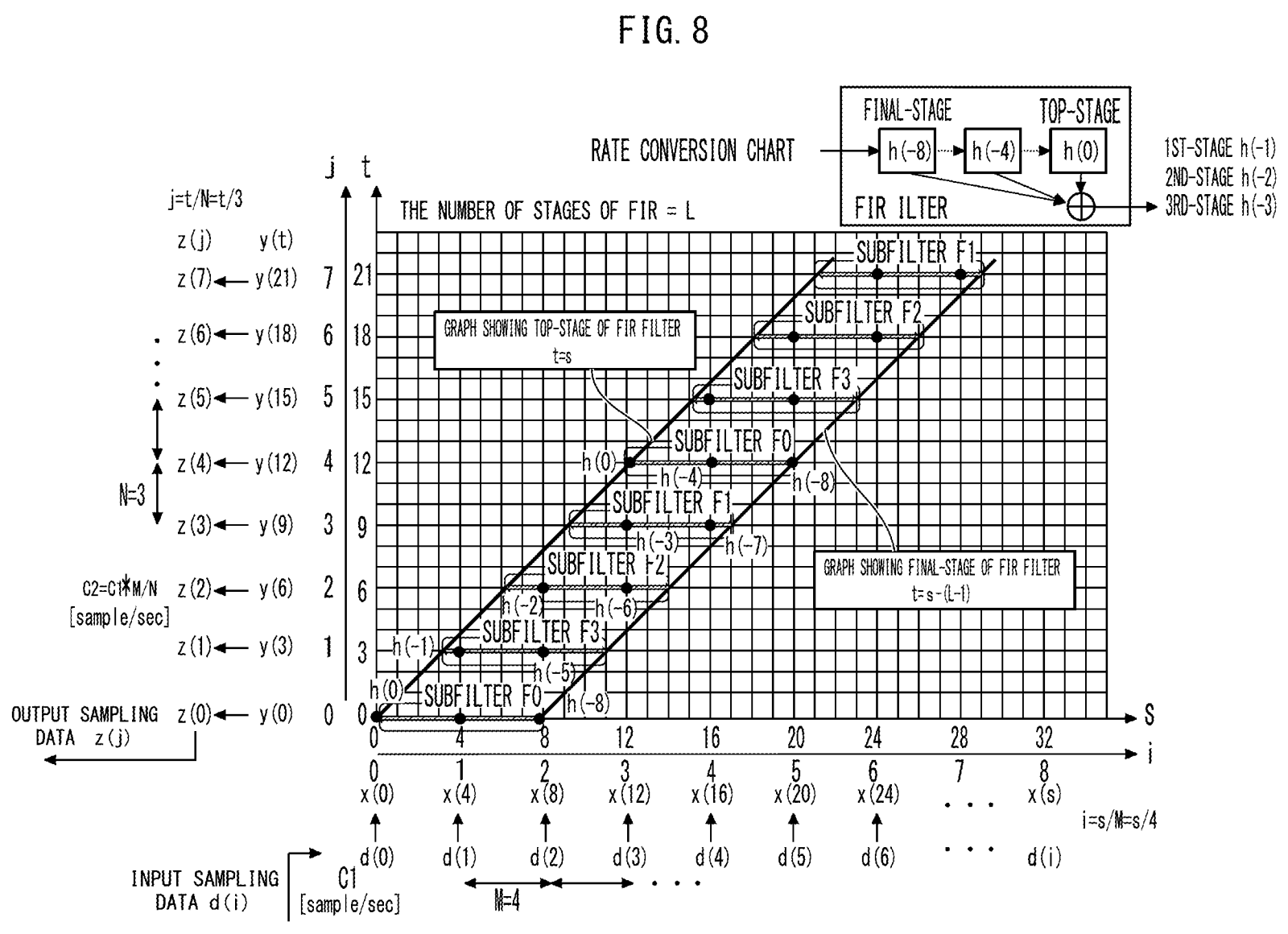

FIG. 8 is a diagram visually showing the operation of sampling rate conversion in the case of M/N=4/3. Hereinafter, FIG. 8 will be referred to as a "rate conversion chart." The horizontal axis represents the variable "i" indicating order of the input sampled signals d(i). Each of the input sampled signals d(i) corresponding to i is inputted to the sampling rate converter 12. For reference, the filter input data x(n) obtained by inserting three "0's" between the input sampled signals d(i) are written as x(s) using a variable s that is obtained by multiplying the rate of the variable i by M (M=4). The filter input data x(s) are data to be inputted to the digital filter 14. Here, s=M×i holds. The vertical axis represents the variable "j" indicating order of the output sampled signals z(j). Each of the output sampled signals z(j) corresponding to j is outputted from the sampling rate converter 12. For reference, the filter output data y(n) outputted from the sub-filters F0 to F3 are also written as y(t) using a variable t that is at the same timing as the variable s of the horizontal axis. The filter output data y(t) are outputted as output sampled signals z(j) at every three timings. Here, t=N×j holds.

Further, in the figure, the sub-filters F0 to F3 and the tap coefficients of the sub-filters F0 to F3 are indicated by black circles. In the sub-filters F0 to F3, the input sampled signals d(i) are inputted to the taps indicated by the black circles, and outputs of the sub-filters F0 to F3 are outputted as the output sampled signals z(j).

From the rate conversion chart of FIG. 8, it can be easily understood that, for example, when the input sampled signals d(0), d(1), and d(2) are supplied to the sub-filter F0, an output thereof is outputted as the output sampled signals z(0). Similarly, when the input sampled signals d(1) and d(2) are supplied to the sub-filter F3, an output thereof is outputted as the output sampled signals z(1). When the input sampled signals d(2) and d(3) are supplied to the sub-filter F2, an output thereof is outputted as the output sampled signals z(2). When the input sampled signals d(3) and d(4) are supplied to the sub-filter F1, an output thereof is outputted as the output sampled signals z(3). When the input sampled signals d(3), d(4), and d(5) are supplied to the sub-filter F0, an output thereof is outputted as the output sampled signals z(4).

Here, referring to the rate conversion chart of FIG. 8, it is seen that the supply destination sub-filters of the input sampled signals d(i) can be simply calculated according to conditions as shown below. The input sampled signals d(i) are supplied to the sub-filters F0 to F3 based on points indicated by the black circles in FIG. 8. The black circles correspond to intersection points existing in an area between a straight line t=s and a straight line t=s−(L−1) (t is equal to or larger than 0) among intersection points between straight lines in the vertical direction at the timings of being inputted i=0, 1, 2, . . . (s=0, 4, 8, 12, . . . ) and straight lines in the horizontal direction at the timings of being outputted i=0, 1, 2, . . . (t=0, 3, 6, 9, . . . ). Input sampled signals d(i) at the intersection points are supplied to sub-filters determined by the intersection points. More particularly, when the intersection points are indicated by i and j, d(i) is supplied to "a sub-filter determined by j." Here, j indicates output order of the output sampled signals z(j). The "sub-filter determined by j" can be calculated as a sub-filter F[(j×N) % M] (wherein "(j×N) % M" means a remainder of division of (j×N) by M) as described before.

Here, since the intersection points existing in the area between the straight line t=s and the straight line t=s−(L−1) (t is equal to or larger than 0) are s=M×i and t=N×j, the above can be said as follows. That is, for i and j of intersection points existing in an area between a line j=(M/N)×i and a line j=(M/N)×i−(L−1)/N (j is equal to or larger than 0), among intersection points between i and j, data of d(i) are supplied to sub-filters F[(j×N) % M] (wherein "(j×N) % M" means a remainder of division of (j×N) by M). This is the supply destination sub-filter information calculated by the control circuit 16.

Results of specifically calculating a supply destination sub-filter/supply destination sub-filters of input sampled signals d(i) according to the above conditions are shown below.

(a) In the Case of i=0 and d(0)=x(0) being Inputted

Among intersection points between i=0 and j, only 0 corresponds to j existing in an area between j=(4/3)i and j=(4/3)i−(9−1)/3. At this time, as for a supply destination sub-filter of d(0), sub-filter F[(j×N) % M]=sub-filter F0 holds because of j=0. Therefore, d(0) is supplied to the sub-filter F0.

(b) In the Case of i=1 and d(1)=x(4) being Inputted

Among intersection points between i=1 and j, two of 0 and 1 correspond to j existing in the area between j=(4/3)i and j=(4/3)i−(9−1)/3. At this time, as for supply destination sub-filters of d(1), sub-filter F[(j×N) % M]=sub-filter F0 holds because of j=0, and sub-filter F[(j×N) % M]=sub-filter F3 holds because of j=1. Therefore, d(1) is supplied to the sub-filter F0 and the sub-filter F3.

(c) In the Case of i=2 and d(2)=x(8) being Inputted

Among intersection points between i=2 and j, three of 0, 1, and 2 corresponds to j existing in the area between j=(4/3)i and j=(4/3)i−(9−1)/3. Supply destination sub-filters of d(2) are similarly calculated by sub-filter F[(j×N) % M], and the sub-filter F0, the sub-filter F3, and the sub-filter F2 are obtained.

(d) In the Case of i=3 and d(3)=x(12) being Inputted

Among intersection points between i=3 and j, three of 2, 3, and 4 correspond to j existing in the area between j=(4/3)i and j=(4/3)i−(9−1)/3. Supply destination sub-filters of d(3) are similarly calculated by sub-filter F[(j×N) % M], and the sub-filter F2, the sub-filter F1, and the sub-filter F0 are obtained. For the subsequent input sampled signals d(i) also, supply destination sub-filters are similarly calculated. The supply destination sub-filters for d(i) are indicated by the black circles in the rate conversion chart of FIG. 8.

Further, a result of the sub-filter F0 calculated for j=0, a result of the sub-filter F3 calculated for j=1, a result of the sub-filter F2 calculated for j=2, a result of the sub-filter F1 calculated for j=3, a result of the sub-filter F0 calculated for j=4, . . . are outputted from the multiplexer 15 with the sampling rate C2 as the output sampled signals z(0), z(1), z(2), z(3), z(4), . . . as shown in FIG. 7.

In order to continuously output the output sampled signals z(j), it is necessary to properly match input timings of the input sampled signals d(i) to output timings of the output sampled signals z(j). If, at the time of outputting any of the output sampled signals z(j) with the sampling rate C2, the output timing is not matched to the input timing of d(i), then the output sampled signals z(j) is not generated, and the period may fluctuate because of waiting for generation thereof.

For example, in FIG. 7, it is necessary to delay the output timing of the output sampled signals z(0) from the input timing of d(2). This is because z(0) cannot be calculated unless d(2) is inputted. The same goes for the input timing of the input sampled signals d(5) and the output timing of the sampled signals z(4).

Such input/output data that requires matching between timings can also be calculated from the rate conversion chart of FIG. 8. That is, on points overlapping with the straight line j=(M/N)×i−(L−1)/N, among the intersection points between i and j, the input timings of the input sampled signals d(i) are matched to the output timings of the output sampled signals z(j) (actually, the output timings are delayed from the input timings). In FIG. 8, for example, a point at i=2 and j=0 and a point at i=5 and j=4 apply. In this case, it is necessary to match the input timing of d(5) to the output timing of z(4) so as to match the input timing of d(2) to the output timing of z(0) as in FIG. 7. By the matching between the timings of the input/output data at points, it is possible to continuously output the output sampled signals z(j) with the sampling rate C2 without period fluctuation.

[Operation in the Case of Conversion Rate M/N=3/2]

Next, operation in the case of the conversion rate M/N=3/2 (M=3, N=2) will be explained. Here, for the number of tap taps of the digital filter 14, L=9 holds.

For M=3, the "×M" circuit 19 inserts two "0's" among the input sampled signals d(0), d(1), . . . to generate the filter input data x(0), x(1), x(2), x(3), x(4), . . . . At this time, filter input data other than x(0), x(3), and x(6) become 0. Therefore, Math. 2 becomes the equations below. At this time, the processing rate of the digital filter 14 is C1.

$$y(0) = h(-6) \times (6) + h(-3) \times (3) + h(0) \times (0) \qquad \text{[Math. 6]}$$

$$y(1) = h(-8) \times (9) + h(-5) \times (6) + h(-2) \times (3)$$

$$y(2) = h(-7) \times (9) + h(-4) \times (6) + h(-1) \times (3)$$

$$y(3) = h(-6) \times (9) + h(-3) \times (6) + h(0) \times (3)$$

$$y(4) = h(-8) \times (12) + h(-5) \times (9) + h(-2) \times (6)$$

$$y(5) = h(-7) \times (12) + h(-4) \times (9) + h(-1) \times (6)$$

$$y(6) = h(-6) \times (12) + h(-3) \times (9) + h(0) \times (6)$$

$$y(7) = h(-8) \times (15) + h(-5) \times (12) + h(-2) \times (9)$$

$$y(8) = h(-7) \times (15) + h(-4) \times (12) + h(-1) \times (9)$$

$$y(9) = h(-6) \times (15) + h(-3) \times (12) + h(0) \times (9)$$

$$y(10) = h(-8) \times (18) + h(-5) \times (15) + h(-2) \times (12)$$

$$y(11) = h(-7) \times (18) + h(-4) \times (15) + h(-1) \times (12)$$

$$y(12) = h(-6) \times (18) + h(-3) \times (15) + h(0) \times (12)$$

$$y(13) = h(-8) \times (21) + h(-5) \times (18) + h(-2) \times (15)$$

$$y(14) = h(-7) \times (21) + h(-4) \times (18) + h(-1) \times (15)$$

$$y(15) = h(-6) \times (21) + h(-3) \times (18) + h(0) \times (15)$$

. . .

Here, according to Math. 6, among the tap coefficients h(−8) to h(0) of the 9-tap FIR filter, h(−6), h(−3), and h(0) are used in order to obtain a result of y(0); h(−8), h(−5), and h(−2) are used in order to obtain a result of y(1); h(−7), h(−4), and h(−1) are used in order to obtain a result of y(2); h(−6), h(−3), and h(−0) are used again in order to obtain a result of y(3); h(−8), h(−5), and h(−2) are used again in order to obtain a result of y(4); h(−7), h(−4), and h(−1) are used again in order to obtain a result of y(5).

Thus, among the nine tap coefficients h(−8) to h(0), every Mth (M=3) tap coefficient is selected to configure the following three sub-filters:

$$\text{Sub-filter } F0 = \{h(-6),\ h(-3),\ h(0)\}$$

$$\text{Sub-filter } F1 = \{h(-8),\ h(-5),\ h(-2)\}$$

$$\text{Sub-filter } F2 = \{h(-7),\ h(-4),\ h(-1)\}$$

Calculation is repeated for the sub-filters F0 to F2, and the filter output data y(n) are sequentially generated. That is, in the case of M=3, the 9-tap digital filter 14 is divided into the three sub-filters F0 to F2 by polyphase filtering. Each of these sub-filters is configured with three taps. In FIG. 5, however, the four sub-filters F0 to F3 (ω=3) are shown. This is because, if a configuration is made with the sub-filters F0 to F3 corresponding to the maximum number of sub-filters that can be designed (four, in this case), it becomes possible to respond to various M's. In the case of the digital filter 14 being configured with the three sub-filters F0 to F2 like this time, the fourth sub-filter F3 is not used. In this case also, it is possible to configure the three-tap polyphase filters first and, thereby, configure the whole FIR filter.

Specifically, in the control circuit 16 shown in FIG. 2, configurations of the sub-filters F0 to F2 for given M are calculated, and tap coefficients are set for the sub-filters F0 to F2 as tap coefficient information according to the configuration of the sub-filters F0 to F2. In the case of M=3 described above, the tap coefficients {h(−6), h(−3), h(0)} are set for the sub-filter F0. The tap coefficients {h(−8), h(−5), h(−2)} are set for the sub-filter F1. The tap coefficients {h(−7), h(−4), h(−1)} are set for the sub-filter F2. Nothing is set for the sub-filter F3. It is assumed that tap coefficients {0, 0, 0} are already set for the sub-filter F3.

If tap coefficient information for the conversion rate M/N is stored in advance in the storage circuit 18 of the control circuit 16 shown in FIG. 4, and predetermined tap coefficients are set for the sub-filters F0 to F2 according to the setting of the conversion rate M/N, then it is possible to easily configure the polyphase filters. At this time, the processing rate of each of the sub-filters F0 to F2 is C1.

Next, for N=2, the "1/N" circuit 20 performs thinning from the filter output data y(0), y(1), y(2), . . . leaving every Nth (N=2) filter output data. In this case, Math. 6 becomes the equations below.

$$y(0) = h(-6) \times (6) + h(-3) \times (3) + h(0) \times (0) \qquad \text{[Math. 7]}$$

$$y(2) = h(-7) \times (9) + h(-4) \times (6) + h(-1) \times (3)$$

$$y(4) = h(-8) \times (12) + h(-5) \times (9) + h(-2) \times (6)$$

$$y(6) = h(-6) \times (12) + h(-3) \times (9) + h(0) \times (6)$$

$$y(8) = h(-7) \times (15) + h(-4) \times (12) + h(-1) \times (9)$$

-continued $$y(10) = h(-8) \times (18) + h(-5) \times (15) + h(-2) \times (12)$$

$$y(12) = h(-6) \times (18) + h(-3) \times (15) + h(0) \times (12)$$

$$y(14) = h(-7) \times (21) + h(-4) \times (18) + h(-1) \times (15)$$

$$\ldots$$

According to Math. 7, in the "1/N" circuit 20, among the tap coefficients h(−8) to h(0) of the 9-tap FIR filter, h(−6), h(−3), and h(0) (=the sub-filter F0) are used in order to obtain a result of y(0); h(−7), h(−4), and h(−1) (=the sub-filter F2) are used in order to obtain a result of y(2); h(−8), h(−5), and h(−2) (=the sub-filter F1) are used in order to obtain a result of y(4); h(−6), h(−3), and h(0) (=the sub-filter F0) are used again in order to obtain a result of y(6); h(−7), h(−4), and h(−1) (=the sub-filter F2) are used again in order to obtain a result of y(8); and h(−8), h(−5), and h(−2) (=the sub-filter F1) are used again in order to obtain a result of y(10).

Thus, in the "1/N" circuit 20, calculation is repeated in order of the sub-filters F0, F2, and F1, and filter output data are outputted in order of y(0), y(2), y(4), and y(6), . . .

Relationships between the input sampled signals d(i) and the filter input data x(n) to the digital filter 14 are as follows:

$$d(0)=x(0)$$

$$d(1)=x(3)$$

$$d(2)=x(6)$$

$$d(3)=x(9)$$

. . .

Relationships between the filter output data y(n) of the digital filter 14 and the output sampled signals z(j) are as follows:

$$z(0)=y(0)$$

$$z(1)=y(2)$$

$$z(2)=y(4)$$

$$z(3)=y(6)$$

. . .

Therefore, when Math. 7 is rewritten using the input sampled signals d(i) and the output sampled signals z(j), the equations below are obtained.

$$z(0) = h(-6)d(2) + h(-3)d(1) + h(0)d(0) \qquad \text{[Math. 8]}$$

$$z(1) = h(-7)d(3) + h(-4)d(2) + h(-1)d(1)$$

$$z(2) = h(-8)d(4) + h(-5)d(3) + h(-2)d(2)$$

$$z(3) = h(-6)d(4) + h(-3)d(3) + h(0)d(2)$$

$$z(4) = h(-7)d(5) + h(-4)d(4) + h(-1)d(3)$$

$$z(5) = h(-8)d(6) + h(-5)d(5) + h(-2)d(4)$$

$$\ldots$$

Figure 9:
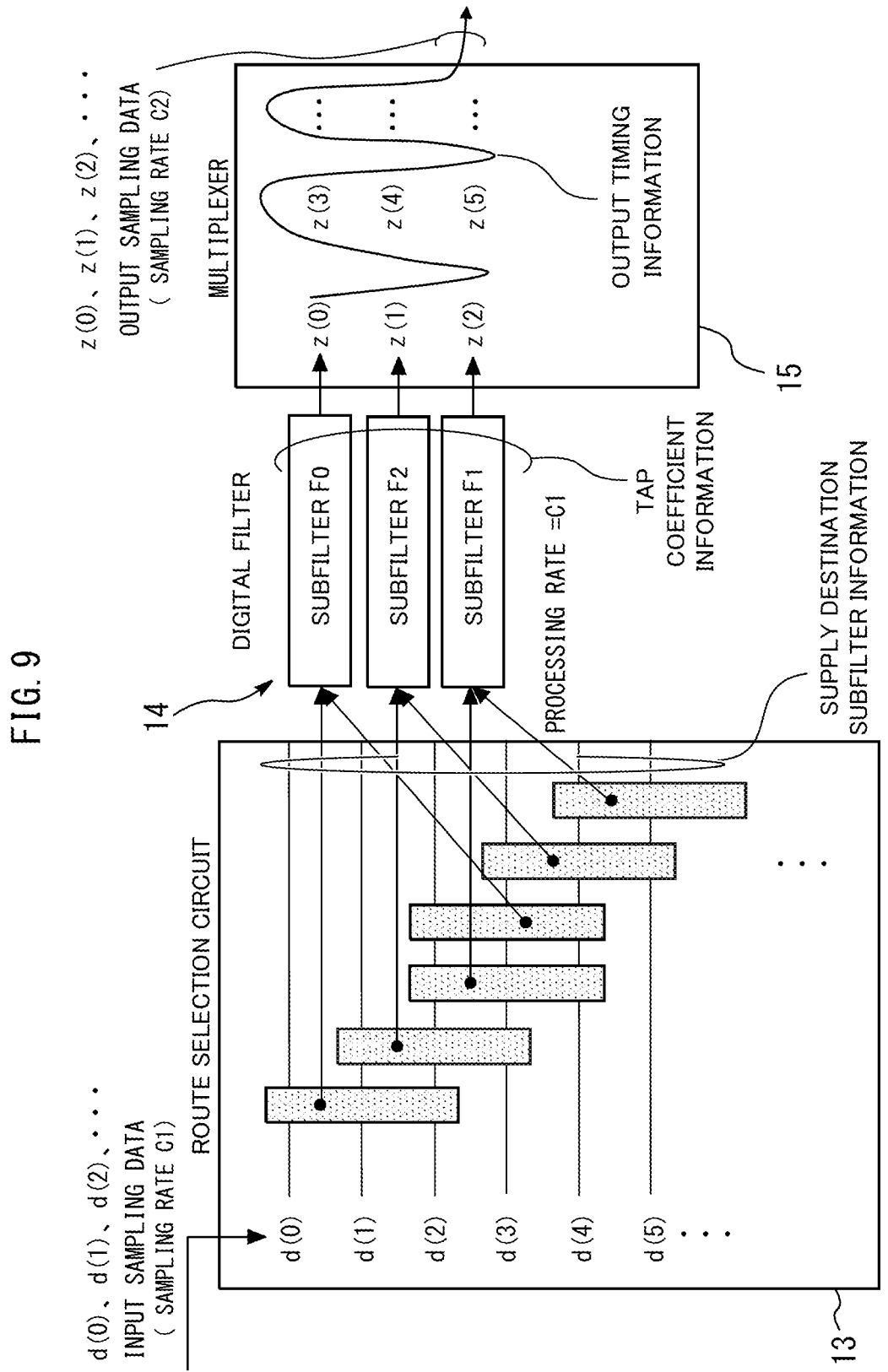
FIG. 9 is a diagram for explaining operation of sampling rate conversion in the case of M/N=3/2.

FIG. 9 is a diagram for explaining operation of sampling rate conversion in the case of M/N=3/2. When Math. 8 is expressed for the input sampled signals d(i), FIG. 9 is obtained. In FIG. 9, straight lines representing the input sampled signals d(i) are drawn in a horizontal direction:

ranges of data to be supplied to the sub-filters F0 to F2 among the input sampled signals d(i) are represented by vertically long rectangles; and which of the sub-filters F0 to F2 each of the data is supplied to is indicated by an arrow extending from each rectangle. Further, it is indicated by right arrows that outputs of the sub-filters F0 to F2 become the output sampled signals z(j). FIG. 9 shows that the input sampled signals d(i) are sequentially inputted to the route selection circuit, and the output sampled signals z(j) are sequentially outputted from the multiplexer. The configuration in the route selection circuit shows not an actual configuration but an image of operation of processing.

According to FIG. 9, the input sampled signals d(0), d(1), and d(2) are inputted to the sub-filter F0 and outputted as output sampled signals z(0). The input sampled signals d(1), d(2), and d(3) are inputted to the sub-filter F2 and outputted as output sampled signals z(1). The input sampled signals d(2), d(3), and d(4) are inputted to the sub-filter F1 and outputted as output sampled signals z(2). The input sampled signals d(2), d(3), and d(4) are inputted to the sub-filter F0 again and outputted as output sampled signals z(3). The input sampled signals d(3), d(4), and d(5) are inputted to the sub-filter F2 again and outputted as output sampled signals z(4).

The outputs of the sub-filters F0, F2, F1, F0, . . . are sequentially selected and sequentially outputted from the multiplexer as the output sampled signals z(0), z(1), z(2), z(3), . . . .

Thus, the sub-filters F0 to F2 can be repeatedly used. The order of repletion of the sub-filters F0 to F2 can be calculated as sub-filter F[(j×N) % M] (wherein % indicates a remainder of division of (j×N) by M).

At this time, when the input sampled signals d(i) are seen in order of being inputted, the input sampled signals d(0) is inputted to the sub-filter F0. The input sampled signals d(1) is inputted to the sub-filters F0 and F2. The input sampled signals d(2) is inputted to the sub-filters F0, F2, F1, and F0. The input sampled signals d(3) is inputted to the sub-filters F2, F1, F0, and F2. The input sampled signals d(4) is inputted to the sub-filters F1, F0, F2, F1, and F0. Relationships between the input sampled signals d(i) and the supply destination sub-filters can be shown like Table 2 below.

TABLE 2

| i | INPUT SAMPLED SIGNALS d(i) | SUPPLY DESTINATION SUB-FILTER |
|---|---|---|
| 0 | d(0) | F0 |
| 1 | d(1) | F0□F2 |
| 2 | d(2) | F0□F2□F1□F0 |
| 3 | d(3) | F2□F1□F0□F2 |
| 4 | d(4) | F1□F0□F2□F1□F0 |
| 5 | d(5) | F2□F1□F0□F2 |
| 6 | d(6) | F1□F0□F2□F1□F0 |
| 7 | d(7) | F2□F1□F0□F2 |
| 8 | d(8) | F1□F0□F2□F1□F0 |
| 9 | d(9) | F2□F1□F0□F2 |
| 10 | d(10) | F1□F0□F2□F1□F0 |
| □□□ | □□□ | □□□ |

As described above, when the conversion rate M/N and the number of taps L are determined, which of the sub-filters F0 to F2 each of the input sampled signals d(i) is to be inputted to is uniquely determined. Further, according to Table 2, from d(5), the supply destination sub-filters for d(3) to d(4) are repeated. Therefore, if the repetition situation is recorded in the storage circuit 18 in the control circuit 16, it is possible to easily specify a supply destination sub-filter as supply destination sub-filter information according to an input of the value i. The route selection circuit 13 of the sampling rate converter 12 supplies the input sampled signals d(i) to the specified sub-filters F0 to F2 according to the supply destination sub-filter information from the control circuit 16.

Figure 10:
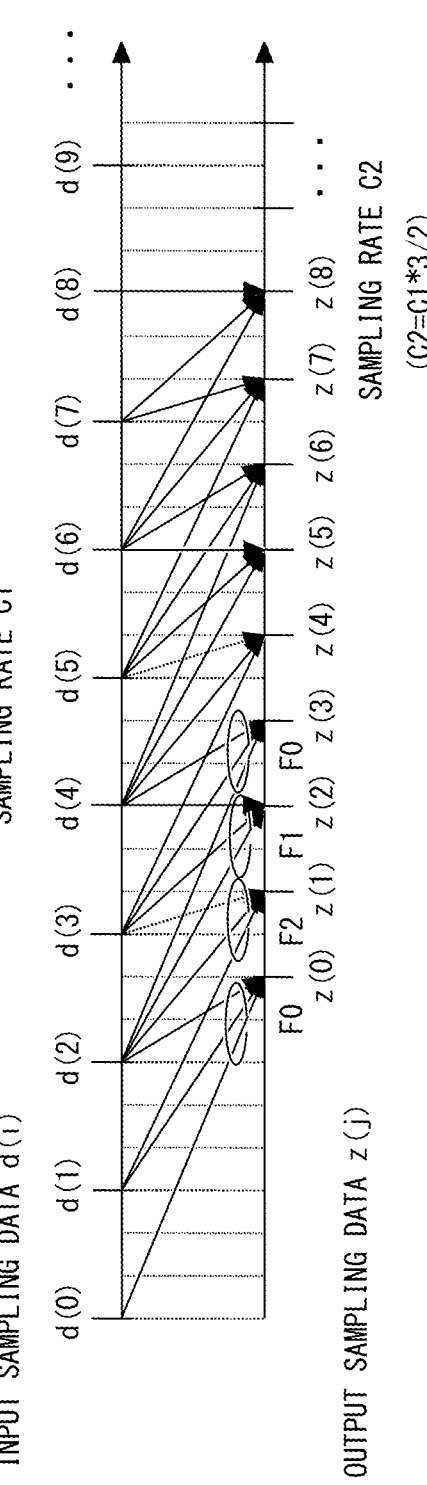
FIG. 10 is a diagram showing relationships between timings of the input sampled signals and timings of the output sampled signals in the case of M/N=3/2.

FIG. 10 is a diagram showing relationships between timings of the input sampled signals and timings of the output sampled signals in the case of M/N=3/2. The upper part of the diagram shows input timings of the input sampled signals d(i), and the lower part shows output timings of the output sampled signals z(j). A fine scale in the horizontal direction indicates an image of basic clocks. Each of the input sampled signals d(i) is inputted every three clocks, and each of the output sampled signals z(j) is outputted every two clocks. Thereby, it is seen that the output sampling rate C2 is converted to be 3/2 times higher than the input sampling rate C1 (the period is converted to 2/3 times).

According to FIG. 10, the input sampled signals d(0), d(1), and d(2) are supplied to the sub-filter F0 and outputted as the output sampled signals z(0). The input sampled signals d(1), d(2), and d(3) are supplied to the sub-filter F2 and outputted as the output sampled signals z(1). The input sampled signals d(2), d(3), and d(4) are supplied to the sub-filter F1 and outputted as the output sampled signals z(2). The input sampled signals d(2), d(3), and d(4) are supplied to the sub-filter F0 and outputted as the output sampled signals z(3). The output sampled signals z(0), z(1), z(2), z(3), z(4), . . . are outputted with the output sampling rate C2. The above is the operation of the multiplexer 15.

In the case of the output sampled signals z(2) being outputted, since all the data (here, d(2), d(3), and d(4)) have to be supplied to the sub-filter F1, the output sampled signals z(2) is outputted after the input sampled signals d(4) is supplied.

Further, it is also possible to input the input sampled signals in parallel and output the output sampled signals in parallel. In this case, the same number of pieces of input sampled signals as the number of parallel inputs are inputted at a time, and the same number of pieces of output sampled signals as the number of parallel outputs are outputted at a time. The relationships between timings of the input sampled signals inputted in parallel and timings of the output sampled signals outputted in parallel are the same as the relationship described above.

Figure 11:
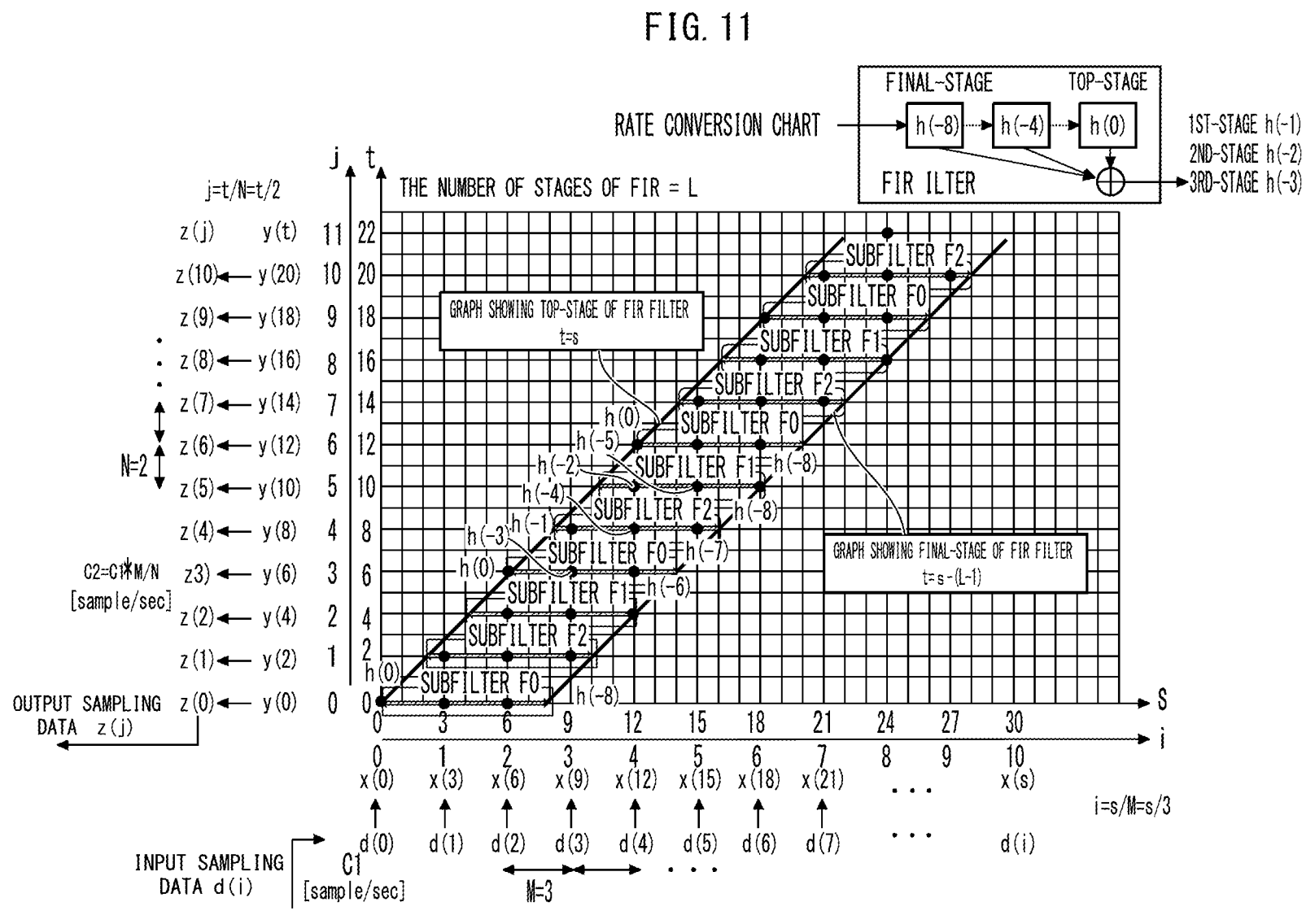

FIG. 11 is a diagram visually showing the operation of sampling rate conversion in the case of M/N=3/2. Hereinafter, FIG. 11 will be referred to as a "rate conversion chart." Similarly to FIG. 8, the horizontal axis represents the variable "i" indicating order of the input sampled signals d(i). Each of the input sampled signals d(i) corresponding to i is inputted to the sampling rate converter 12. For reference, the filter input data x(n) obtained by inserting two "0's" among the input sampled signals d(i) are written as x(s) using a variable s that is obtained by multiplying the rate of the variable i by M (M=3). The filter input data x(s) are data to be inputted to the digital filter 14. Here, s=M×i holds. The vertical axis represents the variable "j" indicating order of the output sampled signals z(j). Each of the output sampled signals z(j) corresponding to j is outputted from the converter. For reference, the filter output data y(n) outputted from the sub-filters F0 to F2 are also written as y(t) using a variable t that is at the same timing as the variable s of the horizontal axis. The filter output data y(t) are outputted as output sampled signals z(j) at every two timings. Here, t=N×j holds.

Further, in FIG. 11, the sub-filters F0 to F2 and the tap coefficients of the sub-filters F0 to F2 are indicated by black circles. In the sub-filters F0 to F2, the input sampled signals d(i) are inputted to the taps indicated by the black circles, and outputs of the sub-filters F0 to F2 are outputted as the output sampled signals z(j).

In the rate conversion chart of FIG. 11, it can be easily understood that, for example, when the input sampled signals d(0), d(1), and d(2) are supplied to the sub-filter F0, an output thereof is outputted as the output sampled signals z(0). Similarly, when the input sampled signals d(1), d(2), and d(3) are supplied to the sub-filter F2, an output thereof is outputted as the output sampled signals z(1). When the input sampled signals d(2), d(3), and d(4) are supplied to the sub-filter F1, an output thereof is outputted as the output sampled signals z(2). When the input sampled signals d(2), d(3), and d(4) are supplied to the sub-filter F0, an output thereof is outputted as the output sampled signals z(3). When the input sampled signals d(3), d(4), and d(5) are supplied to the sub-filter F2, an output thereof is outputted as the output sampled signals z(4).

Here, referring to the rate conversion chart, it is seen that the supply destination sub-filters of the input sampled signals d(i) can be simply calculated according to conditions as shown below. The input sampled signals d(i) are supplied to the sub-filters F1 to F2 based on points indicated by the black circles in FIG. 11. The black circles correspond to intersection points existing in an area between a straight line t=s and a straight line t=s–(L–1) (t is equal to or larger than 0) among intersection points between straight lines in the vertical direction at the timings of being inputted i=0, 1, 2, . . . (s=0, 3, 6, 9, . . . ) and straight lines in the horizontal direction at the timings of being outputted i=0, 1, 2, . . . (s=0, 2, 4, 6, . . . ). Input sampled signals d(i) at the intersection points are supplied to sub-filters determined by the inter-section points. More particularly, when the intersection points are indicated by i and j, d(i) is supplied to "a sub-filter determined by j." Here, j indicates output order of the output sampled signals z(j), and the "sub-filter determined by j" can be calculated as a sub-filter F[(j×N) % M] (wherein % indicates a remainder of division of (j×N) by M) as described before.

Here, since the intersection points existing in the area between the straight line t-s and the straight line t=s–(L–1) (t is equal to or larger than 0) are s=M×i and t=N×j, the above can be said as follows. That is, for i and j of intersection points existing in an area between a straight line j=(M/N)×i and a straight line j=(M/N)×i–(L–1)/N (j is equal to or larger than 0), among intersection points between i and j, data of d(i) are supplied to sub-filters F[(j×N) % M] (wherein % indicates a remainder of division of (j×N) by M). This is the supply destination sub-filter information calculated by the control circuit 16.

Results of specifically calculating a supply destination sub-filter/supply destination sub-filters of input sampled signals d(i) according to the above conditions are shown below.

(a) In the Case of i=0 and d(0)=x(0) being Inputted

Among intersection points between i=0 and j, only 0 corresponds to j existing in an area between j=(3/2)i and j=(3/2)i–(9–1)/2. At this time, as for a supply destination sub-filter of d(0), sub-filter F[(j×N) % M]=sub-filter F0 holds because of j=0. Therefore, d(0) is supplied to the sub-filter F0.

(b) In the Case of i=1 and d(1)=x(3) being Inputted

Among intersection points between i=1 and j, two of 0 and 1 correspond to j existing in the area between $j=(3/2)i$ and $j=(3/2)i-(9-1)/2$. At this time, as for supply destination sub-filters of d(1), sub-filter $F[(j \times N) \% M]$=sub-filter F0 holds because of j=0, and sub-filter $F[(j \times N) \% M]$=sub-filter F2 holds because of j=1. Therefore, d(1) is supplied to the sub-filter F0 and the sub-filter F2.

(c) In the Case of i=2 and d(2)=x(6) being Inputted

Among intersection points between i=2 and j, four of 0, 1, 2, and 3 correspond to j existing in the area between $j=(3/2)i$ and $j=(3/2)i-(9-1)/2$. Similarly, supply destination sub-filters of d(2) are calculated by sub-filter $F[(j \times N) \% M]$, and are the sub-filter F0, the sub-filter F2, the sub-filter F1, and the sub-filter F0.

(d) In the Case of i=3 and d(3)=x(9) being Inputted

Among intersection points between i=3 and j, four of 1, 2, 3, and 4 correspond to j existing in the area between $j=(3/2)i$ and $j=(3/2)i-(9-1)/2$. Similarly, supply destination sub-filters of d(3) are calculated by sub-filter $F[(j \times N) \% M]$ and are the sub-filter F2, the sub-filter F1, the sub-filter F0, and the sub-filter F2. For the subsequent input sampled signals d(i) also, supply destination sub-filters are similarly calculated. The supply destination sub-filters for d(i) are indicated by the black circles in the rate conversion chart of FIG. 11.

Further, a result of the sub-filter F0 calculated for j=0, a result of the sub-filter F2 calculated for j=1, a result of the sub-filter F1 calculated for j=2, a result of the sub-filter F0 calculated for j=3, a result of the sub-filter F2 calculated for j=4, a result of the sub-filter F1 calculated for j=5, . . . are outputted from the multiplexer 15 with the output sampling rate C2 as the output sampled signals z(0), z(1), z(2), z(3), z(4), z(5), . . . as shown in FIG. 10.

In order to continuously output the output sampled signals z(j), it is necessary to properly match input timings of the input sampled signals d(i) to output timings of the output sampled signals z(j). If, at the time of outputting any of the output sampled signals z(j) with the output sampling rate C2, the output timing is not matched to an input timing of d(i), then the output sampled signals z(j) is not generated, and the period may fluctuate because of waiting for generation thereof.

For example, in FIG. 10, it is necessary to delay the output timing of the output sampled signals z(2) from the input timing of d(4). This is because z(2) cannot be calculated unless d(4) is inputted. The same goes for the input timing of the input sampled signals d(6) and the output timing of the sampled signals z(5).

Such input/output data that requires matching between timings can also be calculated from the rate conversion chart of FIG. 11. That is, on points overlapping with the straight line $j=(M/N) \times i-(L-1)/N$, among the intersection points between i and j, the input timings of the input sampled signals d(i) are matched to the output timings of the output sampled signals z(j) (actually, the output timings are delayed from the input timings). In FIG. 11, for example, a point at i=4 and j=2 and a point at i=6 and j=5 apply. In this case, as illustrated in FIG. 10, it is necessary to match the input timing of d(4) to the output timing of z(2) and match the input timing of d(6) to the output timing of z(5). By the matching between the timings of the input/output data at points, it is possible to continuously output the output sampled signals z(j) with the output sampling rate C2 without period fluctuation.

[Common Method for Configuring Sampling Rate Converter]

From the operation in the case of M/N=4/3 and operation in the case of M/N=3/2 that have been described above, the configuration and operation of the sampling rate converter according to the present embodiment can be summarized as below.

(1) Prerequisites

When M/N (M and N are integers equal to or larger than 1) is set as a conversion rate, the sampling rate converter 12 converts the input sampled signals d(i) (i=0, 1, 2, . . . ) sampled with the input sampling rate C1 to the output sampled signals z(j) (j=0, 1, 2, . . . ) sampled with the output sampling rate C2 that is M/N times the input sampling rate. Here, i indicates order of the input data; and j indicates order of the output data. As a relationship between the input sampling rate C1 and the output sampling rate C2, $C2=C1 \times M/N$ holds.

The digital filter 14 is configured with an FIR filter. The number of taps of the FIR filter before polyphasing is assumed to be L. Tap coefficients are indicated by $\{h(-L-1)), h(-(L-2)), . . . , h(-1), h(0)\}$. Here, h(0) is referred to as a 0th-tap or top-tap coefficient: h(-1) is referred to as a 1st-tap coefficient, and h(-(L-1)) is referred to as a (L-1)th-tap or final-tap coefficient. For example, in the case of L=9, tap coefficients are $\{h(-8) . . . h(0)\}$.

(2) Construction of Sub-Filters F0 to F$\omega$

The digital filter 14 is configured with the plurality of sub-filters F0 to F$\omega$ arranged in parallel, tap coefficients being set for the sub-filters F0 to F$\omega$, respectively, according to a conversion rate. The plurality of sub-filters F0 to F$\omega$ are specifically referred to as the sub-filter F0, the sub-filter F1, the sub-filter F2, . . . , the sub-filter Fn (n is an integer equal to or larger than 3), . . . , a sub-filter F(M-1). Here, n is a variable for convenience of description and is not intended to limit the number of sub-filters. The number of sub-filters is determined by M.

The tap coefficients of the 0th tap, Mth tap, 2Mth tap, 3Mth tap, . . . are sequentially set for the sub-filter F0 within L taps.

The tap coefficients of the (M-1)th tap, (2M-1)th tap, (3M-1)th-tap, . . . are sequentially set for the sub-filter F1 within L taps.

The tap coefficients of the (M-2)th tap, (2M-2)th tap, (3M-2)th tap, . . . are sequentially set for the sub-filter F2 within L taps.

The tap coefficients of the (M-n)th tap, (2M-n)th tap, (3M-n)th tap, . . . are sequentially set for the sub-filter Fn within L taps.

The tap coefficients of the 1st tap, (2M-(M-1))th tap, (3M-(M-1))th tap, . . . are sequentially set for the sub-filter F(M-1) within L taps.

For example, in the case of M=4, the sub-filters F0 to F(M-1)=F0 to F3 holds. When the digital filter 14 is a 9-tap FIR filter, tap coefficients of the sub-filters F0 to F3 can be calculated as follows.

The 0th-tap, 4th-tap, and 8th-tap coefficients h(0), h(-4), and h(-8) are set to the sub-filter F0.

The 3rd-tap and 7th-tap coefficients h(-3) and h(-7) are set to the sub-filter F1.

The 2nd-tap and 6th-tap coefficients h(-2) and h(-6) are set to the sub-filter F2.

The 1st-tap and 5th-tap coefficients h(-1) and h(-5) are set to the sub-filter F3.

As for the number of tap coefficients in a sub-filter, it is necessary to prepare the maximum number of taps within the scope of design. There may be a case where a tap coefficient that is not used may occur. In that case, by setting 0 to the tap coefficient that is not used, it is possible to cause only the necessary number of tap coefficients to be effective.

(3) Method for Determining Supply Destination Sub-Filter by Route Selection Circuit 13

The route selection circuit 13 supplies each of the input sampled signals d(i)inputted with the input sampling rate to at least one of the sub-filters F0 to Fω of the digital filter 14 according to the conversion rate M/N. Specifically, for a value i of each of the inputted input sampled signals d(i), the route selection circuit 13 extracts all values of j included in a range equal to or smaller than (M/N)×i, equal to or larger than (M/N)−(L−1)/N, and equal to or larger than 0. For each of the extracted values of j, a remainder of division of (j×N) by M is calculated. The calculated remainder is written as "(j×N) % M." The ((j×N) % M)th sub-filter identified by each of the values of j in this way is assumed to be a supply destination sub-filter to which the input sampled signals d(i) is to be supplied.

(4) Method for Outputting Output Sampled Signals z(j) by Multiplexer 15

After the input sampled signals are supplied to the sub-filters F0 to Fω by the operation of (3), calculation results of the sub-filters F0 to Fω are temporarily stored in the multiplexer 15 as the output sampled signals z(j). Next, the multiplexer 15 outputs the outputs of the plurality of sub-filters F0 to Fω with the output sampling rate in determined order according to the conversion rate M/N. Specifically, for input timings of the input sampled signals d(i), the multiplexer 15 outputs the output sampled signals z(j) at timings of j=(M/N)×i−(L−1)/N with the output sampling rate C2.

[Operation of Control Circuit 16 of Sampling Rate Converter 12]

(1) Setting of Tap Coefficient Information for Sub-Filters F0 to Fω

In accordance with "(2) Construction of sub-filters F0 to Fω" described above, the control circuit 16 sets tap coefficients for the plurality of sub-filters F0 to Fω, respectively, according to the supplied conversion rate M/N. Thereby, the sub-filters F0 to Fω corresponding to the conversion rate M/N are constructed in the digital filter 14. Each of the sub-filters F0 to Fω themselves may have a function of setting a tap coefficient according to the conversion rate M/N.

(2) Setting of Supply Destination Sub-Filter Information for Route Selection Circuit 13

In accordance with "Method for determining supply destination sub-filter by route selection circuit 13" described above, the control circuit 16 sets sub-filters F0 to Fω to which the inputted input sampled signals d(i) are to be supplied, for the route selection circuit 13 according to the conversion rate M/N. The route selection circuit 13 itself may have a function of setting the sub-filters F0 to Fω to which the input sampled signals d(i) are to be supplied, according to the conversion rate M/N.

(3) Setting of Output Timing Information for Multiplexer 15

In accordance with "Method for outputting output sampled signals z(j) by multiplexer 15" described above, the control circuit 16 sets timings of outputting the results of the sub-filters F0 to Fω as the output sampled signals z(j), for the multiplexer 15 according to the conversion rate M/N. The multiplexer 15 itself may have a function of setting the timings of outputting the results of the sub-filters F0 to Fω according to the conversion rate M/N.

The control circuit 16 can perform calculation at the time of the conversion rate M/N being supplied, using the calculation circuit 17, and set each of the pieces of information described above according to a result of the calculation. Further, by performing calculation of an assumed conversion rate M/N in advance and storing a result of the calculation into the storage circuit 18 such as a memory, information about the stored result may be set in response to supply of the conversion rate M/N. In the former case of performing calculation, a memory is not required, and it is possible to respond to a conversion rate M/N beyond expectation. In the latter case of using a memory, advantages are obtained that there is almost no delay due to calculation, and that the circuit configuration can be simplified and small-scaled.

As for the coefficients of the sub-filters F0 to Fω, the sub-filters F0 to Fω do not have to directly hold the values. For example, it is possible to hold the values in the control circuit 16 and provide the values to the sub-filters F0 to Fω via wiring. Thereby, a memory can be shared, and the circuit scale can be reduced. In that case also, it is possible to, due to the regularity of the sub-filters F0 to Fω, set filter coefficients for a desired conversion rate only by holding M' coefficients for an M'/N' conversion rate obtained by converting a desired conversion rate to an irreducible fraction.

As described above, in the sampling rate converter 12 according to the present embodiment, the digital filter 14 is configured with the plurality of sub-filters F0 to Fω arranged in parallel, tap coefficients being set for the sub-filters F0 to Fω according to the conversion rate M/N. The route selection circuit 13 supplies each of the input sampled signals inputted with the input sampling rate to at least one of the sub-filters F0 to Fω of the digital filter 14 according to the conversion rate M/N. The multiplexer 15 outputs the outputs of the plurality of sub-filters F0 to Fω as the output sampled signals with the output sampling rate in determined order according to the conversion rate M/N. Thereby, it is possible to easily perform sampling rate conversion with an arbitrary conversion rate M/N. Therefore, it is possible to implement a plurality of sampling rate conversions with a simple configuration.

The above description has been made on a case of upsampling in which M>N holds. The present disclosure, however, is not limited to upsampling but is applicable to downsampling in which M<N holds, which is, of course, within the scope of the technological idea of the present disclosure.

REFERENCE SIGNS LIST 2 transmitting optical module; 6 transmit digital signal processing circuit; 7 transmitter-side sampling rate converter; 8 D/A converter; 9 A/D converter; 11 receive digital signal processing circuit; 12 receiver-side sampling rate converter; 13 route selection circuit; 14 digital filter; 15 multiplexer; 16 control circuit; 17 calculation circuit; 18 storage circuit; F0~Fω sub-filter

The invention claimed is:

1. A sampling rate converter converting input signals d(i) (i=0, 1, 2, . . . ) sampled with an input sampling rate to output signals z(j) (j=0, 1, 2, . . . ) sampled with an output sampling rate that is M/N times the input sampling rate when M/N (M and N are integers equal to or larger than 1) is set as a conversion rate, comprising:

a digital filter configured with a plurality of sub-filters arranged in poly-phase, tap coefficients being set for the sub-filters, respectively, according to the conversion rate;

route selection circuitry supplying each of the input signals inputted with the input sampling rate to at least one of the sub-filters of the digital filter according to the conversion rate; and a multiplexer outputting outputs of the plurality of sub-filters as the output signals with the output sampling rate in determined order according to the conversion rate.

2. The sampling rate converter according to claim 1, further comprising control circuitry using at least one of calculation circuitry and storage circuitry, setting the sub-filters to which the inputted input signals are to be supplied, for the route selection circuitry according to the conversion rate, setting the tap coefficients for the plurality of sub-filters, respectively, according to the conversion rate, and setting timings of outputting results of the sub-filters for the multiplexer according to the conversion rate.

3. The sampling rate converter according to claim 1, wherein the digital filter includes at least L taps which are a sum of taps of the plurality of sub-filters included in the digital filter, the plurality of sub-filters includes a sub-filter F0, a sub-filter F1, a sub-filter F2, . . . , a sub-filter Fn (n is an integer equal to or larger than 3), . . . , a sub-filter F(M−1), 0th, Mth, 2Mth, 3Mth, . . . tap coefficients the digital filter are sequentially set for the sub-filter F0 within L stages, (M−1)th, (2M−1)th, (3M−1)th, . . . tap coefficients of the digital filter are sequentially set for the sub-filter F1 within L stages, (M−2)th, (2M−2)th, (3M−2)th, . . . tap coefficients of the digital filter are sequentially set for the sub-filter F2 within L stages, (M−n)th, (2M−n)th, (3M−n)th, . . . tap coefficients of the digital filter are sequentially set for the sub-filter Fn within L stages, . . .

1st stage, (2M−(M−1))th, (3M−(M−1))th, . . . tap coefficients of the digital filter are sequentially set for the sub-filter F(M−1) within L stages.

4. The sampling rate converter according to claim 1, wherein the route selection circuitry extracts all values of i included in a range equal to or smaller than (M/N)×i, equal to larger than M/N)−(L−1)/N, and equal to or larger than 0 for a value i of the inputted input signals d(i), and calculates a remainder of division of (j×N) by M for each of the extracted values of i, and supplies the input signals d(i) to ((j×N) % M)th sub-filter wherein the calculated remainder is (j×N) % M signals, and the multiplexer outputs the output signals z(M/N)×i−(L−1)/N) with the output sampling rate at an input timing of the input signals d(i).

5. The sampling rate converter according to claim 4, wherein a remainder of division of (j×N) by M is (j×N) % M, and the sub-filter identified by a value of the j is the ((j×N) % M)th sub-filter.

6. A communication system comprising:

transmit digital signal processing circuitry processing a transmit signal;

a transmitter-side sampling rate converter converting a sampling rate of output data of the transmit digital signal processing circuitry;

a D/A converter converting an output signal of the transmitter-side sampling rate converter to an analog electrical signal;

a transmitting optical module converting an output signal of the D/A converter to an optical signal and transmitting the optical signal;

a receiving optical module receiving the optical signal and converting the received optical signal to an analog electrical signal;

an A/D converter converting the analog electrical signal to a digital electrical signal:

a receive-side sampling rate converter converting a sampling rate of the output signal of the A/D converter; and receive digital signal processing circuitry processing an output signal of the receive-side sampling rate converter, wherein the transmitter-side sampling rate converter or the receive-side sampling rate converter is the sampling rate converter according to claim 1.

7. A sampling rate conversion method converting input signals d(i) (i=0, 1, 2, . . . ) sampled with an input sampling rate to output signals z(j) (j=0, 1, 2, . . . ) sampled with an output sampling rate that is M/N times the input sampling rate when M/N (M and N are integers equal to or larger than 1) is set as a conversion rate, comprising:

supplying each of the input signals inputted with the input sampling rate to at least one of sub-filters of a digital filter according to the conversion rate by route selection circuitry, the digital filter being configured with the sub-filters arranged in parallel, tap coefficients being set for the sub-filters, respectively, according to the conversion rate; and outputting outputs of the plurality of sub-filters as the output Samples signals by a multiplexer with the output sampling rate in determined order according to the conversion rate.

* * * * *